United States Patent
Lee et al.

(10) Patent No.: US 12,149,850 B2
(45) Date of Patent: Nov. 19, 2024

(54) IMAGE SENSOR AND ELECTRONIC APPARATUS INCLUDING THE IMAGE SENSOR

(71) Applicant: SAMSUNG ELECTRONICS CO., LTD., Suwon-si (KR)

(72) Inventors: Junho Lee, Incheon (KR); Sookyoung Roh, Yongin-si (KR); Seokho Yun, Seoul (KR); Sangyun Lee, Yongin-si (KR); Choonlae Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 17/899,076

(22) Filed: Aug. 30, 2022

(65) Prior Publication Data

US 2023/0084394 A1    Mar. 16, 2023

(30) Foreign Application Priority Data

Sep. 15, 2021   (KR) .................. 10-2021-0123466

(51) Int. Cl.
*H04N 25/77*   (2023.01)
*G06T 7/50*    (2017.01)
(Continued)

(52) U.S. Cl.
CPC .............. *H04N 25/77* (2023.01); *G06T 7/50* (2017.01); *H04N 23/11* (2023.01); *H04N 23/84* (2023.01); *G06T 2207/10048* (2013.01)

(58) Field of Classification Search
CPC ........ H04N 25/77; H04N 23/11; H04N 23/84; G06T 7/50; G06T 2207/10048;
(Continued)

(56) References Cited

U.S. PATENT DOCUMENTS 8,748,799 B2   6/2014   Wober
9,337,220 B2   5/2016   Yu et al.
(Continued)

FOREIGN PATENT DOCUMENTS

CN   110312088 A   10/2019
CN   110611778 A   12/2019
(Continued)

OTHER PUBLICATIONS

Ting Zhang et al., "Bias-selected full Red/Green/Blue color sensing and imaging based on inversely stacked radial PINIP junctions", Nano Futures, vol. 4, 2020, (10 pages).
(Continued)

*Primary Examiner* — Hung H Lam
(74) *Attorney, Agent, or Firm* — Sughrue Mion, PLLC

(57) ABSTRACT

An image sensor is provided for obtaining an ultra-high resolution image. The image sensor includes a plurality of two-dimensionally arranged pixels, each of the plurality of pixels including a first meta-photodiode that selectively absorbs light of a red wavelength band, a second meta-photodiode that selectively absorbs light in a green wavelength band, and a third meta-photodiode that selectively absorbs light of a blue wavelength band. A width of each of the plurality of pixels of the image sensor may be less than a diffraction limit.

20 Claims, 23 Drawing Sheets

(51) Int. Cl.
*H04N 23/11* (2023.01)
*H04N 23/84* (2023.01)

(58) Field of Classification Search
CPC ......... H01L 27/14601; H01L 27/14621; H01L 27/14607; H01L 27/14647
See application file for complete search history.

(56) References Cited

U.S. PATENT DOCUMENTS

| | | | |
|---|---|---|---|
| RE48,548 E * | 5/2021 | Fukuda | H01L 27/14647 |
| 2011/0102651 A1 * | 5/2011 | Tay | H01L 27/14687 |
| | | | 348/294 |
| 2012/0327277 A1 | 12/2012 | Myhrvold | |
| 2014/0293102 A1 * | 10/2014 | Vogelsang | H04N 25/772 |
| | | | 348/294 |
| 2015/0171146 A1 * | 6/2015 | Ooki | H01L 27/14636 |
| | | | 257/40 |
| 2016/0118430 A1 | 4/2016 | Nam et al. | |
| 2016/0240580 A1 | 8/2016 | Xianyu et al. | |
| 2017/0054924 A1 * | 2/2017 | Chuang | H04N 23/11 |
| 2018/0081081 A1 * | 3/2018 | Schade | G01K 11/00 |
| 2018/0158856 A1 * | 6/2018 | Han | H01L 31/02327 |
| 2019/0189696 A1 * | 6/2019 | Yamaguchi | H04N 23/12 |
| 2020/0045248 A1 * | 2/2020 | Nishino | H01L 27/14649 |
| 2021/0210531 A1 | 7/2021 | Park et al. | |
| 2022/0223751 A1 | 7/2022 | Lee et al. | |
| 2023/0261020 A1 | 8/2023 | Yun et al. | |

FOREIGN PATENT DOCUMENTS

| | | |
|---|---|---|
| KR | 10-2016-0099386 A | 8/2016 |
| KR | 10-2021-0048953 A | 5/2021 |
| KR | 10-2021-0102026 A | 8/2021 |

OTHER PUBLICATIONS

Communication dated Jan. 23, 2023, by the European Patent Office in corresponding EP Patent Application No. 22193902.8.
Office Action issued on Jun. 8, 2023 by the Korean Patent Office in corresponding KR Patent Application No. 10-2021-0123466.

* cited by examiner

[Security]

IMAGE SENSOR AND ELECTRONIC APPARATUS INCLUDING THE IMAGE SENSOR

CROSS-REFERENCE TO RELATED APPLICATION

This application is based on and claims priority under 35 U.S.C. § 119 to Korean Patent Application No. 10-2021-0123466, filed on Sep. 15, 2021, in the Korean Intellectual Property Office, the disclosure of which is incorporated by reference herein in its entirety.

BACKGROUND

1. Field

The disclosure relates to image sensors and electronic devices including the same.

2. Description of the Related Art

An image sensor generally senses a color of incident light by using a color filter. However, because the color filter absorbs light of a color other than the light of a color corresponding to the filter, light utilization efficiency may be reduced. For example, when an RGB color filter is used, because only ⅓ of incident light is transmitted and the remaining ⅔ is absorbed, the light utilization efficiency is only about 33%. Most light loss of an image sensor is caused by a color filter. Accordingly, a method of separating a color into each pixel of an image sensor without using a color filter has been attempted.

On the other hand, as the demand for high resolution increases, the pixel size is gradually decreasing, which may limit the color separation function. In addition, because the color separation method is a method in which energy entering a unit pixel is divided and absorbed into R, G, and B effective areas, each sub-pixel is responsible for one color, and resolution degradation may occur due to under-sampling, which is present in signal processing. Accordingly, a method of implementing full color pixels suitable for high resolution implementation is being sought.

SUMMARY

Provided are image sensors having a full color pixel and electronic apparatuses including the image sensors.

Additional aspects will be set forth in part in the description which follows and, in part, will be apparent from the description, or may be learned by practice of the presented embodiments of the disclosure.

According to an aspect of the disclosure, there is provided an image sensor including: a plurality of pixels two-dimensionally arranged, each of the plurality of pixels including: a first meta-photodiode configured to selectively absorb light of a red wavelength band, a second meta-photodiode configured to selectively absorb light in a green wavelength band and a third meta-photodiode configured to selectively absorb light in a blue wavelength band, wherein a width p of each of the plurality of pixels is less than or equal to a diffraction limit.

Each of the first meta-photodiode, the second meta-photodiode, and the third meta-photodiode has a rod shape including a first conductivity-type semiconductor layer, an intrinsic semiconductor layer, and a second conductivity-type semiconductor layer stacked in a first direction, wherein a cross-section of the first meta-photodiode perpendicular to the first direction has a first width, a cross-section of the second meta-photodiode perpendicular to the first direction has a second width, and a cross-section of the third meta-photodiode perpendicular to the first direction has a third width, and wherein the first width, the second width and the third width are different from each other.

A height of each of the first meta-photodiode, the second meta-photodiode, and the third meta-photodiode in the first direction is 500 nm or more.

The first width, the second width, and the third width are in a range of about 50 nm to about 200 nm.

The width p is in a range of 0.25 μm≤p≤0.45 μm.

The first width is larger than the second width and the second width is larger than the third width.

A number of first meta-photodiodes included in a pixel is one, a number of second meta-photodiodes included in the pixel is one, and a number of third meta-photodiodes included in the pixel is two, wherein the first meta-photodiode, the second meta-photodiode, and the third meta-photodiode are provided so that a line connecting centers of the one first meta-photodiode, the one second meta-photodiodes, and the two third meta-photodiodes is a square.

The two third meta-photodiodes are arranged in a diagonal direction of the square.

A number of first meta-photodiodes included in a pixel is one, a number of second meta-photodiodes included in the pixel is more than one, and a number of third meta-photodiode included in the pixel is more than one, and wherein the first meta-photodiode is provided at the center of the pixel.

The second meta-photodiode and the third meta-photodiode surround the first meta-photodiode in a square or regular hexagonal shape.

The image sensor further includes a fourth meta-photodiode that selectively absorbs light in an infrared wavelength band in each of the plurality of pixels.

A width of a cross-section of the fourth meta-photodiode perpendicular to the first direction is greater than the first width, the second width, and the third width.

A number of fourth meta-photodiodes included in a pixel is one, a number of first meta-photodiodes included in the pixel is more than one, a number of second meta-photodiodes included in the pixel is more than one, and a number of third meta-photodiode included in the pixel is more than one, and wherein the fourth meta-photodiode is provided at the center of the one pixel.

The image sensor further includes a plurality of lenses facing the plurality of pixels in a one-to-one manner.

The image sensor further includes a circuit board supporting the first meta-photodiode, the second meta-photodiode, and the third meta-photodiode, the circuit board including circuit elements for processing signals from the plurality of pixels.

According to another aspect of the disclosure, there is provided an image sensor including: a plurality of pixels two-dimensionally arranged, each of the plurality of pixels including: two or more meta-photodiodes that selectively absorb light of two or more different wavelength bands, and a width of each of the plurality of pixels is less than or equal to a shortest wavelength among different wavelength bands.

Each of the two or more meta-photodiodes has a rod shape including a first conductivity-type semiconductor layer, an intrinsic semiconductor layer, and a second conductivity-type semiconductor layer stacked in a first direction, wherein the two or more meta-photodiodes include a first meta-photodiode, a second meta-photodiode, and a third meta-photodiode, wherein a cross-section of the first meta-photodiode perpendicular to the first direction has a first width, a cross-section of the second meta-photodiode perpendicular to the first direction has a second width, and a cross-section of the third meta-photodiode perpendicular to the first direction has a third width, and wherein the first width, the second width and the third width are different from each other.

Among the two or more meta-photodiodes, a first meta-photodiode absorbs light of a first wavelength, and a second meta-photodiode absorbs light of a second wavelength, wherein the first wavelength is longer than the second wavelength, and wherein the first meta-photodiode has a greater width than the second meta-photodiode.

According to another aspect of the disclosure, there is provided an electronic apparatus including: a lens assembly including one or more lenses, the lens assembly configured to form an optical image of an object, an image sensor configured to convert the optical image formed by the lens assembly into an electrical signal and a processor configured to process the electrical signal generated by the image sensor, wherein the image sensor includes a plurality of pixels two-dimensionally arranged, each of the plurality of pixels including a first meta-photodiode configured to selectively absorb light of a red wavelength band, a second meta-photodiode configured to selectively absorb light of a green wavelength band and a third meta-photodiode configured to selectively absorb light of a blue wavelength band, and wherein a width p of each of the plurality of pixels satisfies the following: $p<\lambda \cdot F$, where, F is an F-number of the lens assembly, and $\lambda$ is a center wavelength of a blue wavelength band.

Each of the plurality of pixels of the image sensor further comprises a fourth meta-photodiode that selectively absorbs light of an infrared wavelength band, and the processor calculates color information and depth information of the object.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
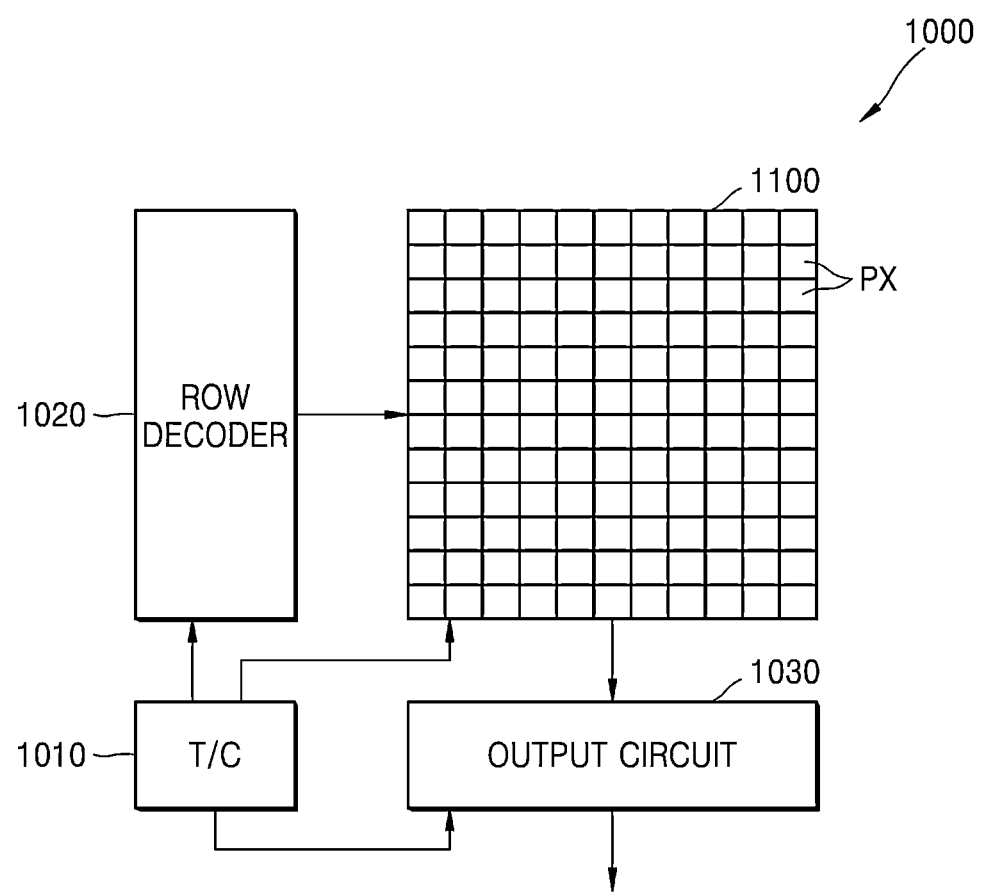
FIG. 1 is a block diagram of an image sensor according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereafter, the inventive concept will be described more fully with reference to the accompanying drawings. The example embodiments of the disclosure are capable of various modifications and may be embodied in many different forms. In the drawings, like reference numerals refer to like elements, and the size of each component may be exaggerated for clarity and convenience of explanation.

Hereinafter, when an element or layer is referred to as being "on" or "above" another element or layer, the element or layer may be directly on another element or layer or intervening elements or layers.

Although the terms "first", "second", etc. may be used herein to describe various elements, but these terms are only used to distinguish one element from another. These terms do not limit the difference in materials or structures of the constituent elements.

In the following descriptions, the singular forms include the plural forms unless the context clearly indicates otherwise. When a part "comprises" or "includes" an element in the specification, unless otherwise defined, it is not excluding other elements but may further include other elements.

Also, in the specification, the term "units" or " . . . modules" denote units or modules that process at least one function or operation, and may be realized by hardware, software, or a combination of hardware and software.

The term "above" and similar directional terms may be applied to both singular and plural.

Operations of all methods described herein may be performed in any suitable order unless otherwise indicated herein or otherwise clearly contradicted by context. The use of any and all examples, or exemplary language (e.g., "such as") provided herein, is intended merely to better illuminate the inventive concept and does not pose a limitation on the scope of the inventive concept unless otherwise claimed.

Figure 2:
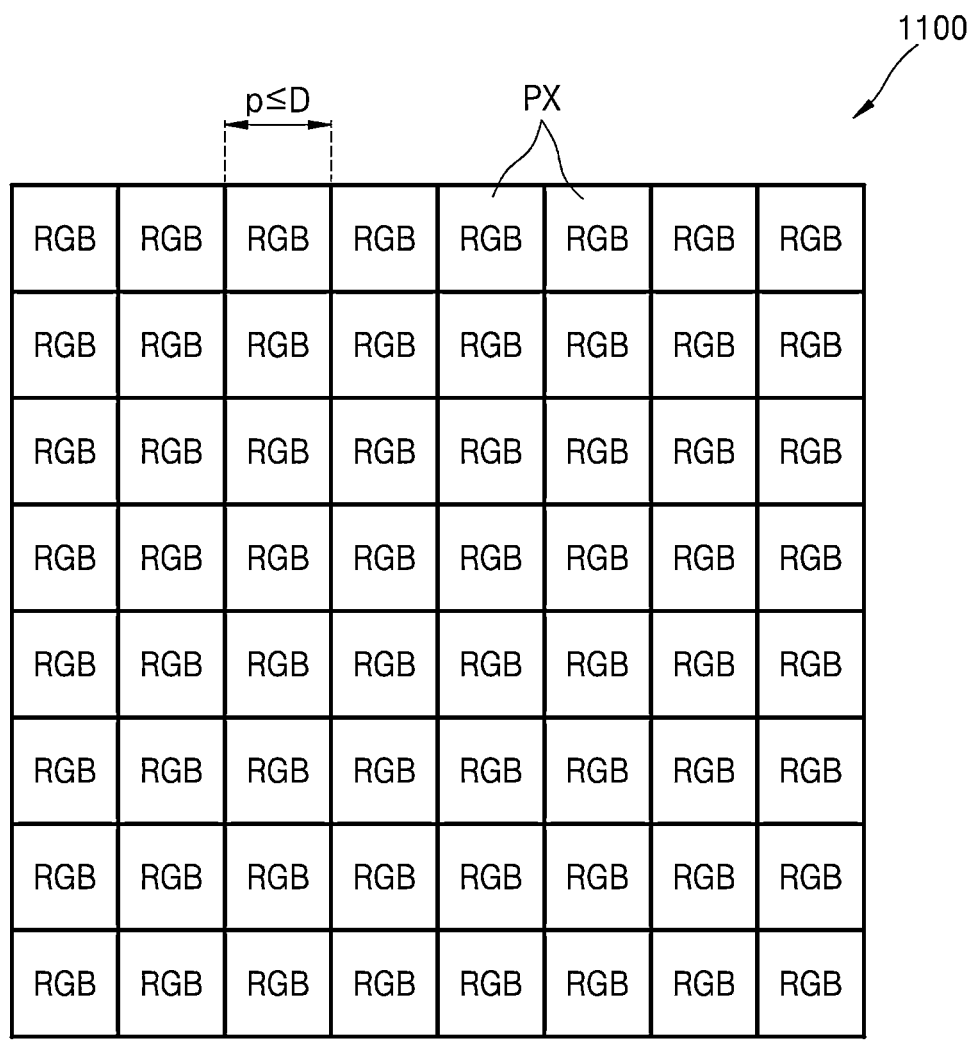
FIG. 2 is a plan view showing a pixel arrangement of a pixel array of the image sensor of FIG. 1.

FIG. 1 is a block diagram of an image sensor 1000 according to an example embodiment, and FIG. 2 is a plan view showing a pixel arrangement of a pixel array 1100 of the image sensor 1000 of FIG. 1.

Referring to FIG. 1, the image sensor 1000 may include the pixel array 1100, a timing controller (T/C) 1010, a row decoder 1020, and an output circuit 1030.

The pixel array 1100 includes pixels PXs two-dimensionally arranged along a plurality of rows and columns. Each of the pixels PX may include a plurality of p-i-n photodiodes, also known as PIN photodiodes, which will be described in detail below with reference to FIG. 3. The p-i-n photodiode is a photodiode with an intrinsic (i) (i.e., undoped) region in between an n-doped region and p-doped region.

The row decoder 1020 selects one row from among rows of the pixel array 1100 based on in response to a row address signal output from the timing controller 1010. For example, the row decoder 1020 selects one row from among rows of the pixel array 1100 in response to a row address signal output from the timing controller 1010. The output circuit 1030 outputs a photo-sensing signal in column units from a plurality of pixels arranged along the selected row. To this end, the output circuit 1030 may include a column decoder and an analog-to-digital converter (ADC). For example, the output circuit 1030 may include a plurality of ADCs respectively provided for columns between the column decoder and the pixel array 1100, or one ADC provided at an output terminal of the column decoder. The timing controller 1010, the row decoder 1020, and the output circuit 1030 may be implemented as a single chip or as separate chips. A processor for processing an image signal output by the output circuit 1030 may be implemented as a single chip together with the timing controller 1010, the row decoder 1020, and the output circuit 1030.

The plurality of pixels PX constituting the pixel array 1100 are full-color pixels, each of which may sense an arbitrary color. That is, light incident on the pixel PX may be divided for each wavelength band, for example, amounts of a red light component, a green light component, and a blue light component may be differentiated and sensed. Accordingly, the loss of light of a specific color according to a color of a sub-pixel, which occurs in a related art image sensor having a color filter, does not occur in the image sensor 1000 according to the example embodiment. In other words, each color component of light incident on the pixel PX may be detected almost regardless of a position of a region within the pixel PX. In this regard, the pixel PX of the image sensor 1000 according to the example embodiment may be referred to as a full-color pixel or an RGB pixel in a sense of distinguishing from a red pixel, a green pixel, a blue pixel, etc., which recognize only specific colors.

As illustrated in FIG. 2, the pixels PX may be two-dimensionally arranged, and a width p of the pixel PX has a size equal to or less than a diffraction limit D. Here, the width p may denote a width in one direction defining a two-dimensional array, and widths in both directions may be equal to or less than the diffraction limit D.

The diffraction limit D may denote a minimum size to which an object may be separated and imaged, and is expressed by the following equation.

$$D=\lambda/(2NA)=\lambda \cdot F$$

Here, λ denotes a wavelength, NA denotes a numerical aperture and F denotes a F-number of an imaging optical system, respectively.

NA is defined as a sine value of an edge ray angle in an imaging space, and the larger the NA, the larger the angular distribution of focused light. F-number is defined by a relation of 1/(2NA). According to a recent trend towards high resolution and miniaturization of imaging systems, an edge ray angle tends to increase, and accordingly, modular lenses with a small F-number are being developed. When an F-number that may be reduced ideally is about 1.0, the diffraction limit D becomes λ.

Under this condition, the diffraction limit D based on a central wavelength of blue light may be expressed as 0.45 μm. That is, each pixel PX constituting the pixel array 1100 may have a size of 0.45 μm×0.45 μm or less. However, this figure is an example, and a specific size may vary according to the imaging optical system provided together.

The minimum width of the pixel PX may be set according to the size and number of meta-photodiodes provided in the pixel PX, which will be described later. The width of the pixel PX may be, for example, 0.25 μm or more, or 0.3 μm or more, but is not limited thereto.

Figure 3:
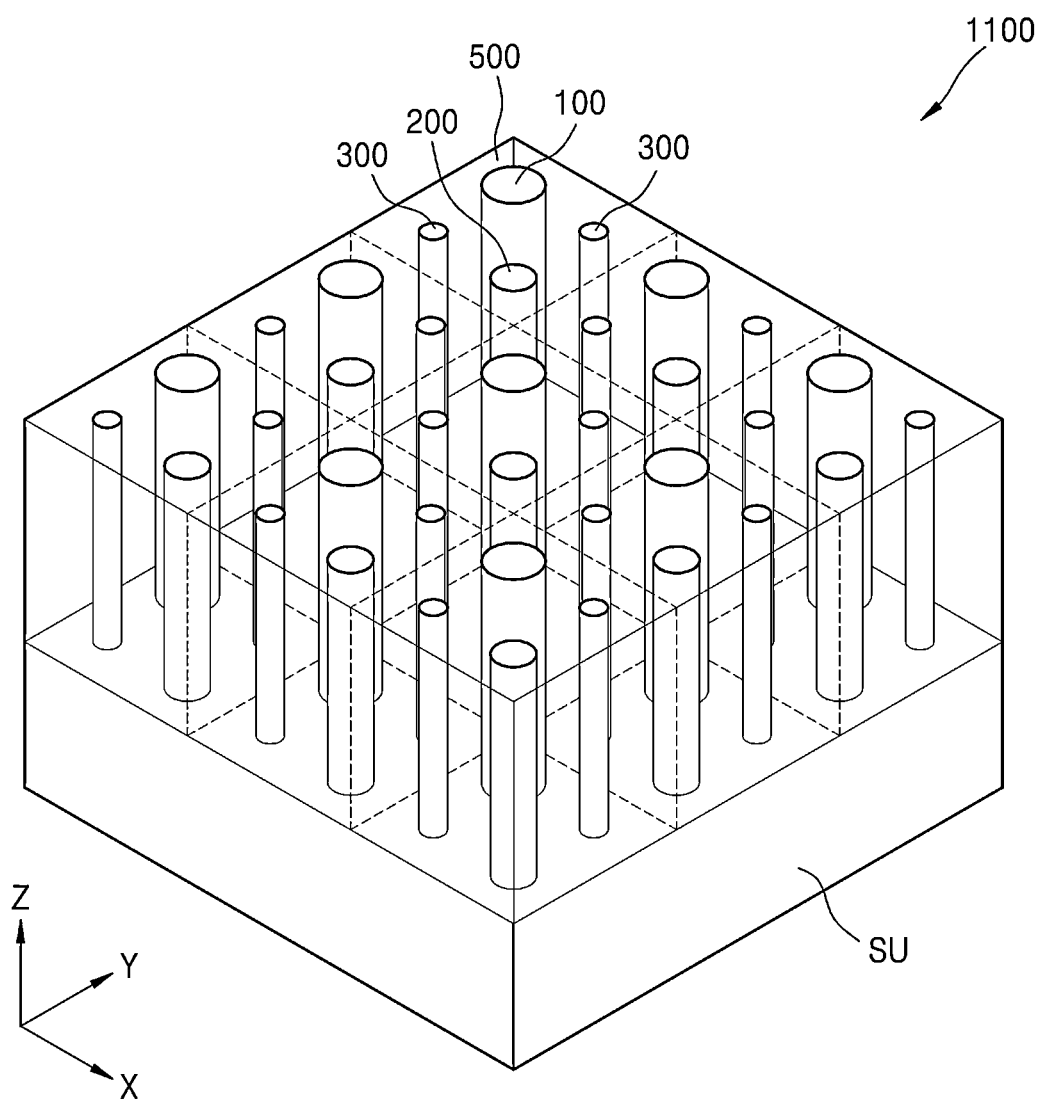
FIG. 3 is a detailed perspective view illustrating a structure of a pixel array of the image sensor of FIG. 1.
Figure 4:
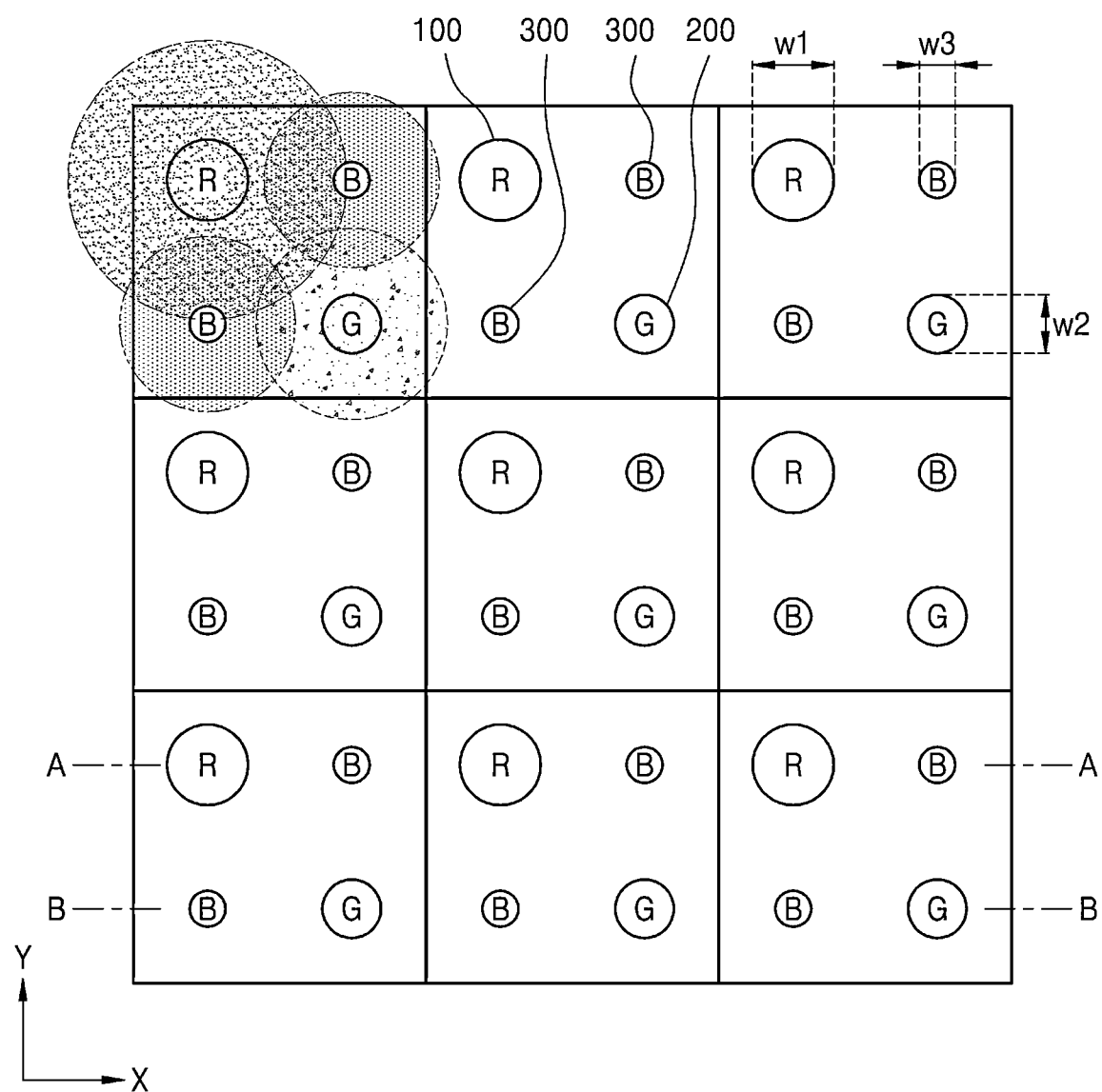
FIG. 4 is a plan view of the pixel array of FIG. 3.
Figure 5A:
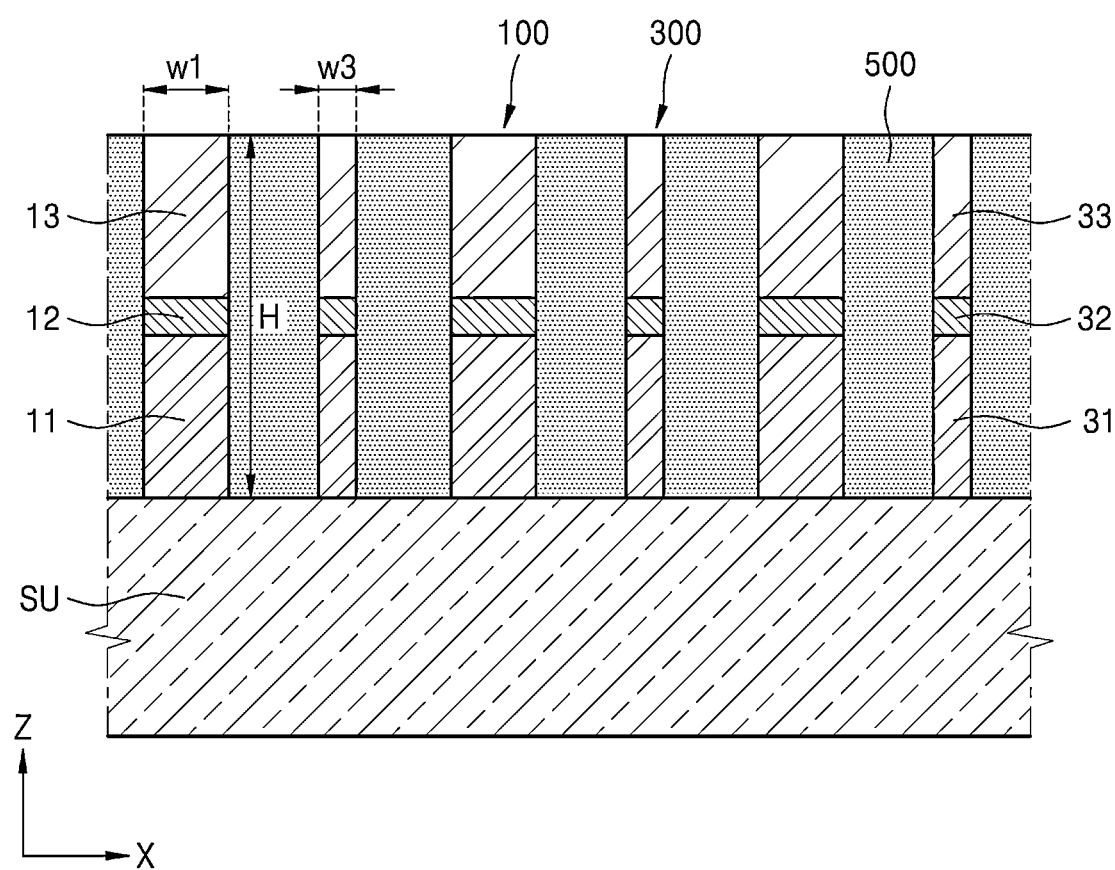
FIGS. 5A and 5B are cross-sectional views taken along lines A-A and B-B of FIG. 4, respectively.
Figure 5B:
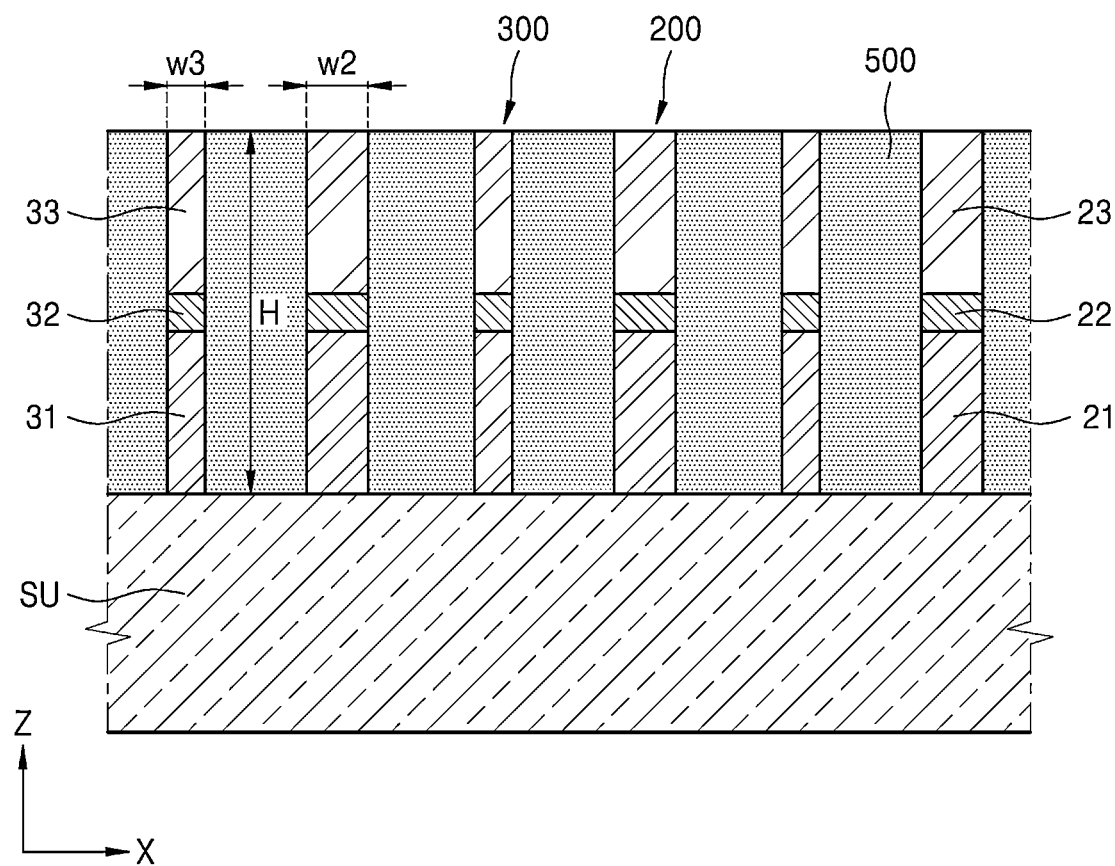

FIG. 3 is a detailed perspective view illustrating a structure of a pixel array 1100 of the image sensor 1000 of FIG. 1. FIG. 4 is a plan view of the pixel array 1100 of FIG. 3, and FIGS. 5A and 5B are cross-sectional views taken along lines A-A and B-B of FIG. 4, respectively.

According to an example embodiment, each of the plurality of pixels PX constituting the pixel array 1100 includes a first meta-photodiode 100 that selectively absorbs light of a red wavelength band, a second meta-photodiode 200 that selectively absorbs light of a green wavelength band, and a third meta-photodiode 300 that selectively absorbs light of a blue wavelength band.

According to an example embodiment, each of the first meta-photodiode 100, the second meta-photodiode 200, and the third meta-photodiode 300 is a rod-shaped vertical photodiode having a shape dimension less than a wavelength of incident light, and selectively absorbs light of a specific wavelength band by a resonance based on a waveguide mode. However, the disclosure is not limited thereto, and as such, according to another example embodiment, the shape of the photodiode may be different. The first meta-photodiode 100, the second meta-photodiode 200, and the third meta-photodiode 300, respectively, have widths w1, w2, and w3 of cross-sections perpendicular to a length direction of the photodiodes, and the widths w1, w2, and w3 are different from each other. The widths w1, w2, and w3 may be, for example, in a range of about 50 nm to about 200 nm. Each of the widths w1, w2, and w3 is set so that light having a wavelength that satisfies each waveguide mode resonance condition among light incident on the pixel PX is guided inside the corresponding photodiode. For example, w1 may be about 100 nm, or may be in a range from about 95 nm to about 105 nm. w2 may be about 85 nm, and or be in a range from about 80 nm to about 90 nm. w3 may be about 60 nm, or may be in a range from about 55 nm to about 65 nm. The first meta-photodiode 100, the second meta-photodiode 200, and the third meta-photodiode 300 having such widths w1, w2, and w3 may absorb red light, green light, and blue light among incident pieces of light, respectively. As shown in FIG. 4, circles shown around the first, second, and third meta-photodiodes 100, 200, and 300 conceptually indicate that red light, green light, and blue light are guided into the inside of the first, second, and third meta-photodiodes 100, 200, and 300, respectively, but are not meant to be limiting. Most of red light incident to an arbitrary position within the pixel PX region may be absorbed by the first meta-photodiode 100, most of green light may be absorbed by the second meta-photodiode 200, and most of blue light may be absorbed by the third meta-photodiode 300.

A single pixel PX may include one first meta-photodiode 100 that absorbs red light, one second meta-photodiode 200 that absorbs green light, and two third meta-photodiodes 300 that absorb blue light. The first, second, and third meta-photodiodes 100, 200, and 300 may be arranged in a form in which a line connecting the centers of the four meta-photodiodes is a square, and the two third meta-photodiodes 300 may be provided in a diagonal direction of the square. However, this arrangement is an example, and the disclosure is not limited thereto. As such, according to another example embodiment, the arrangement of the photodiode may be different.

Referring to FIGS. 5A and 5B, a height H of the first meta-photodiode 100, the second meta-photodiode 200, and the third meta-photodiode 300 may be about 500 nm or more, or 1 μm or more, or 2 μm or more. The height H may be set considering a position where light incident on the photodiode is absorbed, that is, a depth position from a surface of the photodiode. The position may be set considering computational simulation results of FIGS. 6A to 6C, which will be described later. Light with a shorter wavelength having high energy is absorbed closer to an upper surface of the photodiode, and light with a longer wavelength is absorbed at a deeper position of the photodiode. The first meta-photodiode 100, the second meta-photodiode 200, and the third meta-photodiode 300 may have the same height as shown. When the first, second, and third meta-photodiodes 100, 200, and 300 have the same height, in general, the manufacturing process may be easy. In this case, a height at which light absorption is sufficiently achieved may be set in step with a reference to light of a long wavelength band. However, the disclosure is not limited thereto, and the first meta-photodiode 100, the second meta-photodiode 200, and the third meta-photodiode 300 may be set to have different heights from each other. For example, a height h1 of the first meta-photodiode 100, a height h2 of the second meta photodiode, and a height h3 of the third meta-photodiode may be h1>h2>h3. In addition, an appropriate upper limit of these heights h1, h2, and h3 may be set considering quantum efficiency appearing for each wavelength and process difficulty, for example, 10 μm or less or 5 μm or less.

The first, second, and third meta-photodiodes 100, 200, and 300 may be pin photodiodes in a rod shape. The first meta-photodiode 100 may include a first conductivity-type semiconductor layer 11, an intrinsic semiconductor layer 12, and a second conductivity-type semiconductor layer 13. The second meta-photodiode 200 may include a first conductivity-type semiconductor layer 21, an intrinsic semiconductor layer 22, and a second conductivity-type semiconductor layer 23, and the third meta-photodiode 300 may include a first conductivity-type semiconductor layer 31, an intrinsic semiconductor layer 32, and a second conductivity-type semiconductor layer 33. The first, second, and third meta-photodiodes 100, 200, and 300 are illustrated in a cylindrical shape, but are not limited thereto. For example, a polygonal column shape, such as a square column or a hexagonal column, may be adopted.

The first, second, and third meta-photodiodes 100, 200, and 300 may include a silicon-based semiconductor. For example, the first conductivity-type semiconductor layers 11, 21, and 31 may include p-Si, the intrinsic semiconductor layers 12, 22, and 32 may include i-Si, and the second conductivity-type semiconductor layers 13, 23, and 33 may include n-Si. The first conductivity-type semiconductor layers 11, 21, and 31 may include n-Si, and the second conductivity-type semiconductor layers 13, 23, and 33 may include p-Si.

A material 500 around the first, second, and third meta-photodiodes 100, 200, and 300 may be air, or may be a material having a refractive index less than that of the first, second, and third meta-photodiodes 100, 200, and 300. For example, $SiO_2$, $Si_3N_4$, or $Al_2O_3$ may be used as the surrounding material.

A circuit board SU supports the plurality of first, second, and third meta-photodiodes 100, 200, and 300, and may include a circuit element for processing signals from each pixel PX. For example, electrodes and wiring structures for the first, second, and third meta-photodiodes 100, 200, and 300 provided in the pixel PX may be provided on the circuit board SU. In addition, various circuit elements necessary for the image sensor 1000 may be integrated and provided on the circuit board SU. For example, a logic layer including various analog circuits and digital circuits may be provided, and a memory layer in which data is stored may be provided on the circuit board SU. The logic layer and the memory layer may be configured as different layers or the same layer. Some of the circuit elements illustrated in FIG. 1 may be provided on the circuit board SU.

Figure 6A:
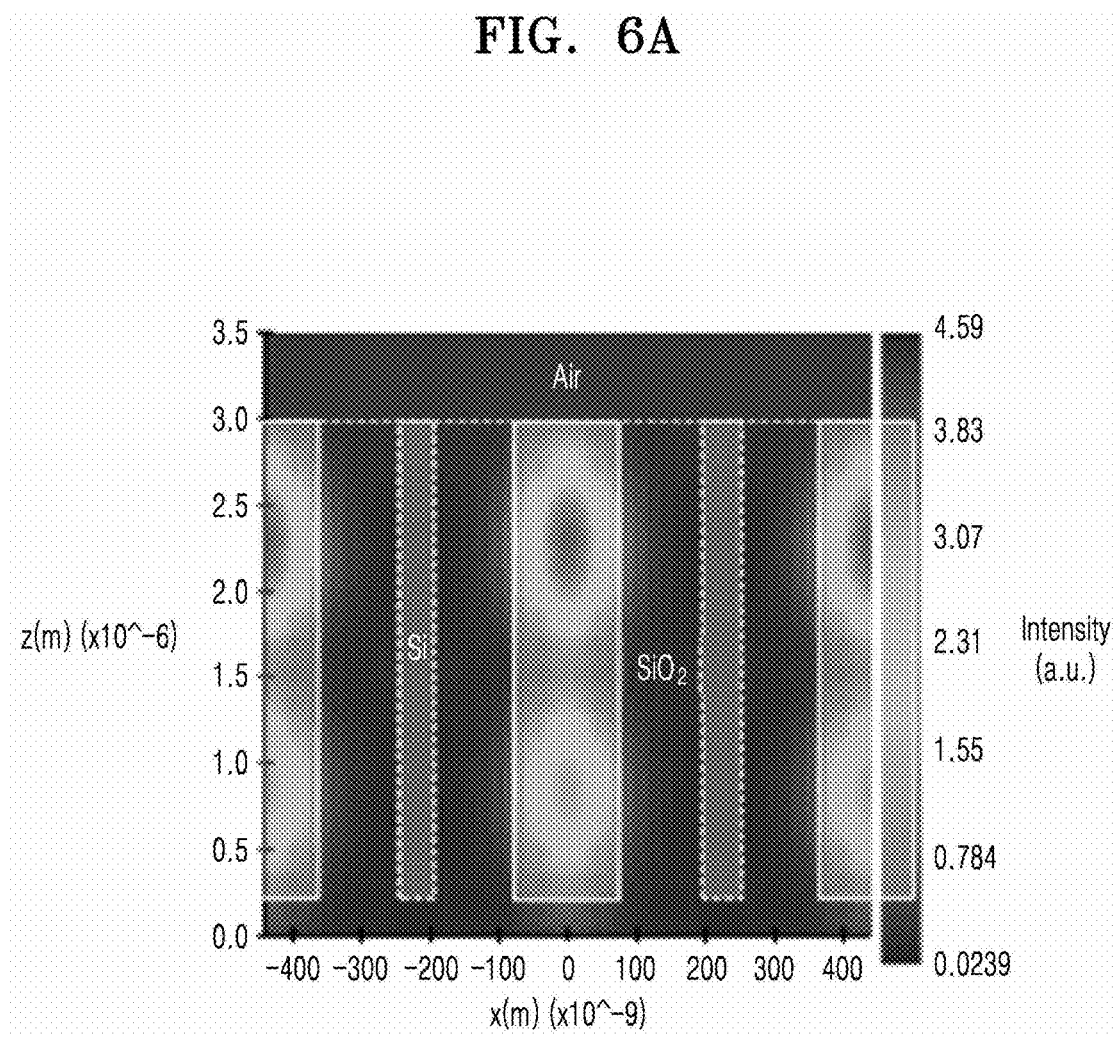
FIGS. 6A to 6C are diagrams illustrating computational simulations in which light incident on an image sensor according to an example embodiment is absorbed by different meta-photodiodes according to color.
Figure 6B:
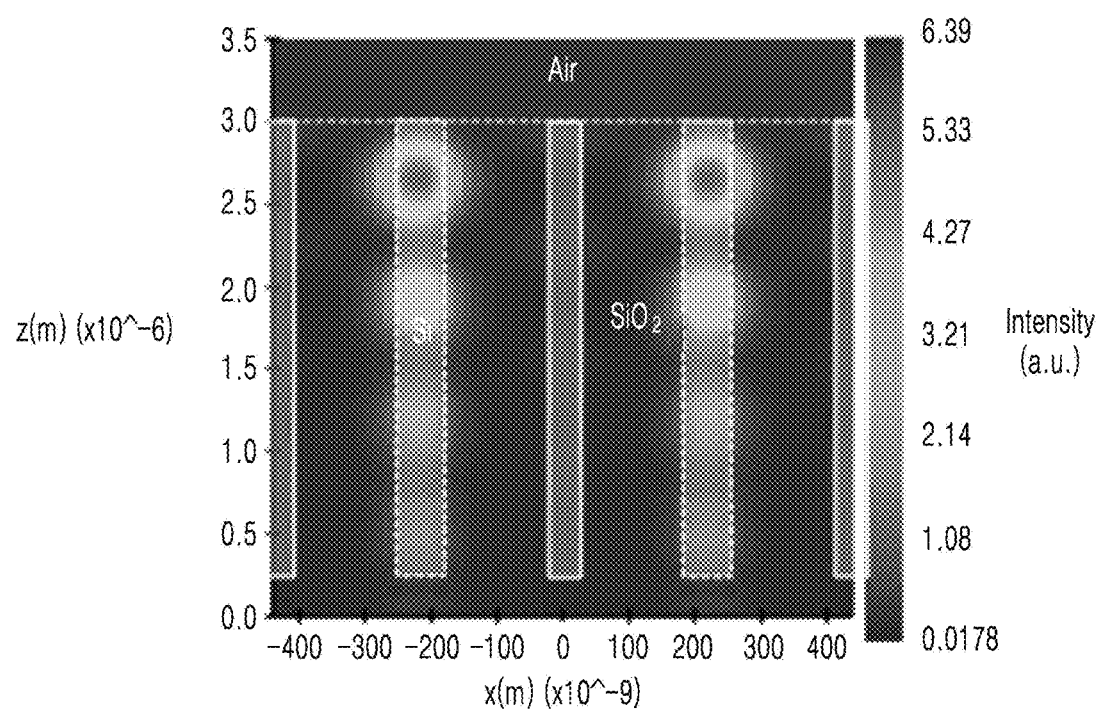
Figure 6C:
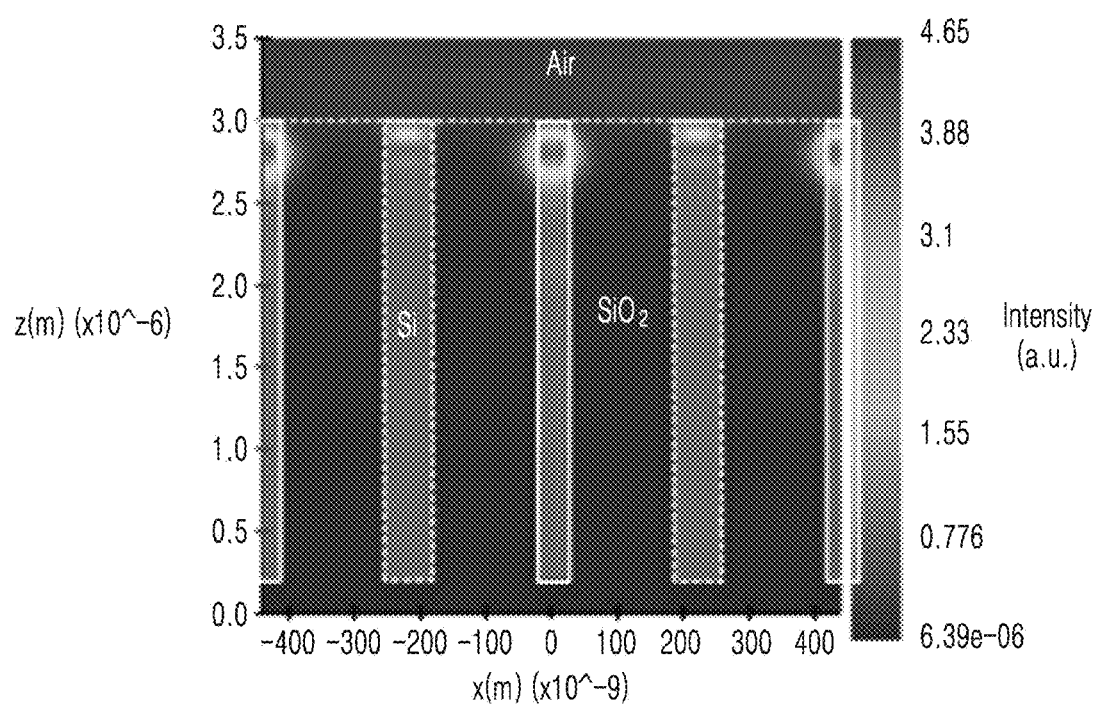

FIGS. 6A to 6C are diagrams illustrating computational simulations in which light incident on an image sensor according to an example embodiment is absorbed by different meta-photodiodes according to color.

FIG. 6A shows a light intensity distribution at the cross-section of FIG. 5A when red light having a wavelength of 610 nm is incident on a pixel array 1100, and FIGS. 6B and 6C show the light intensity distribution at the cross-section of FIG. 5B.when green light having a wavelength of 540 nm and blue light having a wavelength of 430 nm are incident, respectively, on the cross-section of FIG. 5B.

In FIG. 6A, it may be seen that light concentrates at a position of the first meta photodiode, and FIGS. 6B and 6C show that light concentrates at positions of the second meta-photodiode and the third meta photodiode, respectively.

Figure 7:
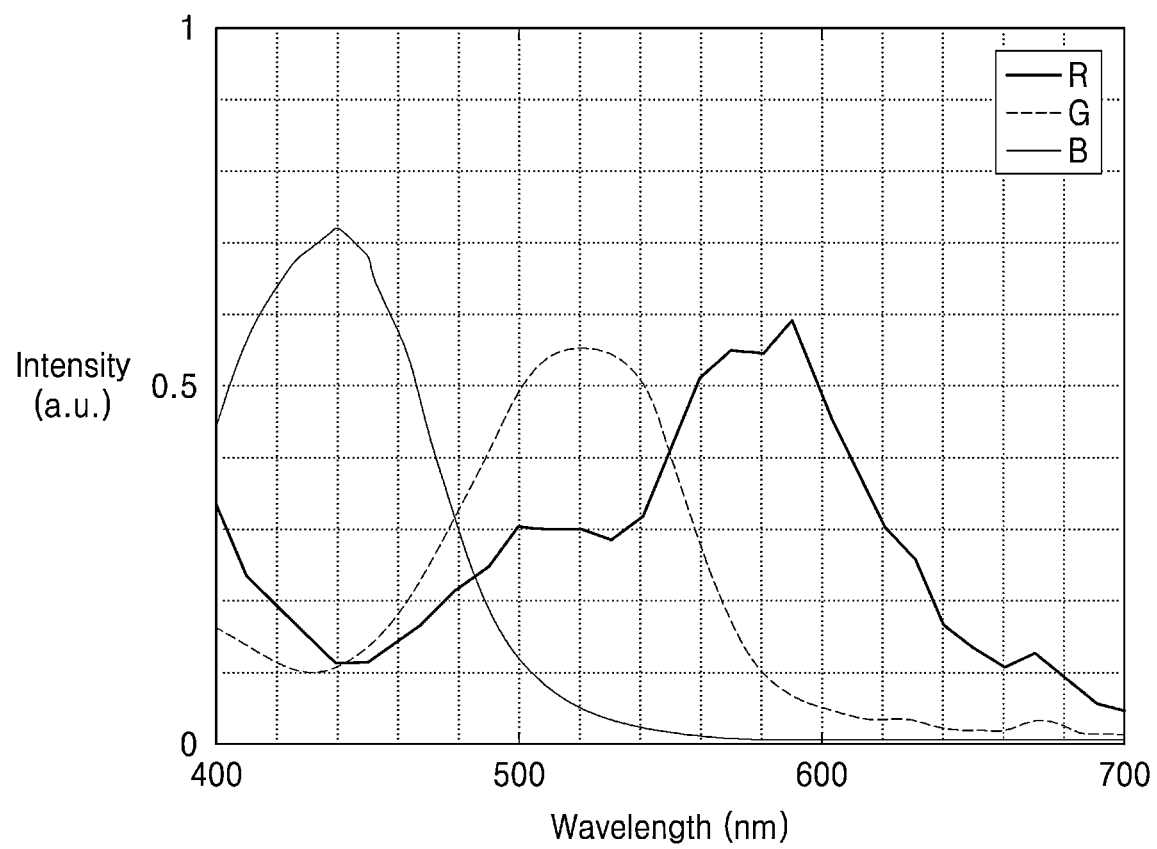
FIG. 7 is a graph showing the efficiency for each color of an image sensor according to an example embodiment.

FIG. 7 is a graph showing the efficiency for each color of the image sensor 1000 according to an example embodiment.

In the graph, it is a case when a width of the pixel PX is about 0.45 μm, and the sensing efficiency or bandwidth for light of R, G, and B wavelengths is generally and similarly well represented.

Figure 8:
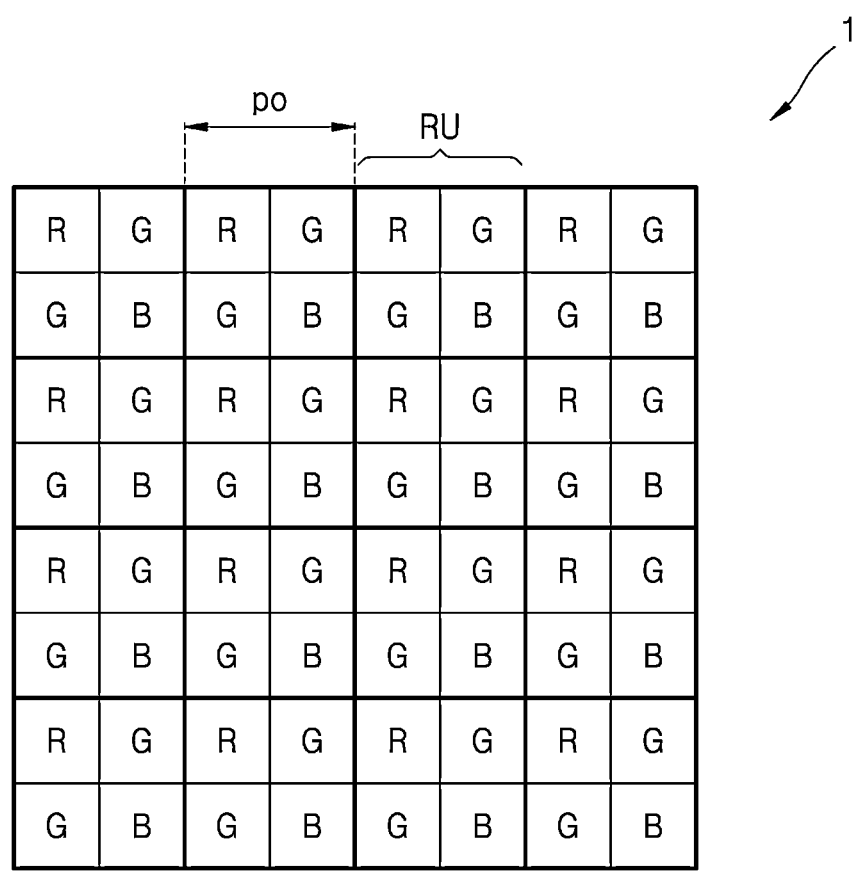
FIG. 8 shows an example pixel arrangement of an image sensor according to a comparative example.
Figure 9:
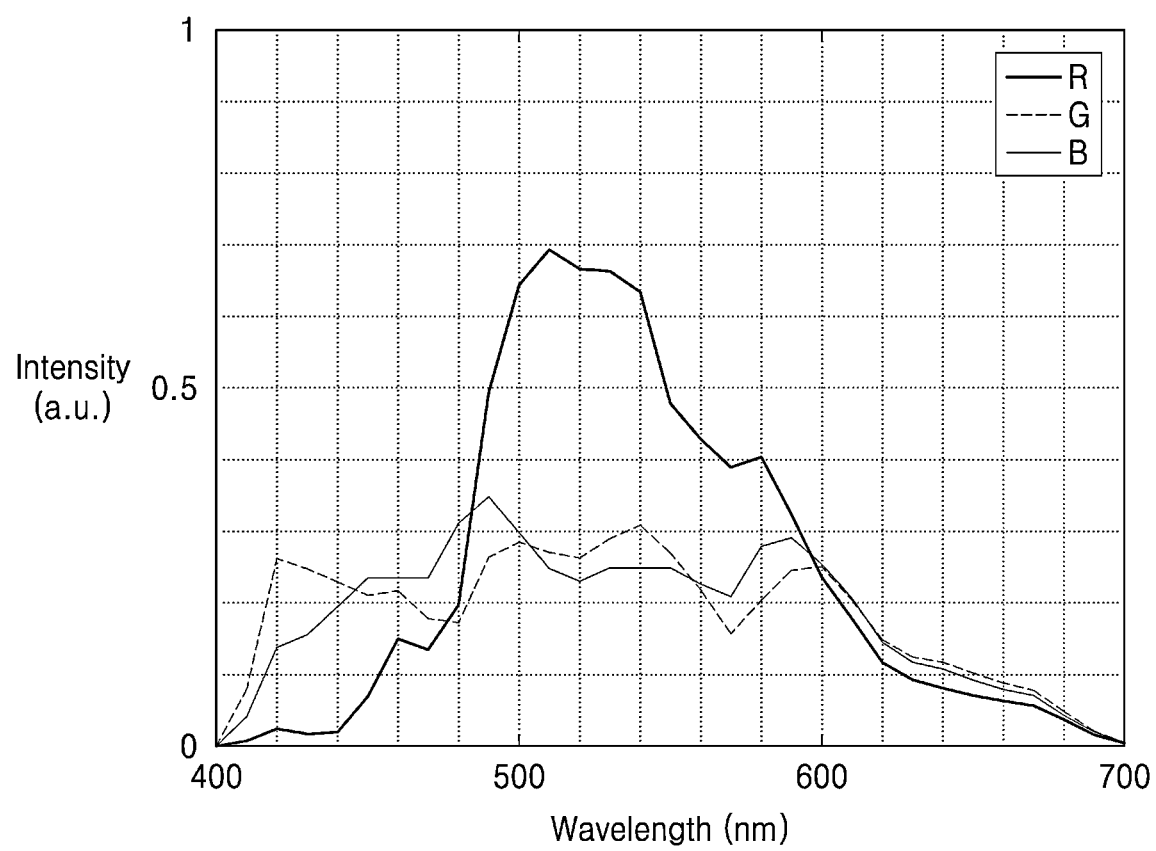
FIG. 9 is a graph showing the efficiency for each color of an image sensor according to a comparative example.

FIG. 8 is an example pixel arrangement of an image sensor according to the comparative example, and FIG. 9 is a graph showing the efficiency for each color of the image sensor according to the comparative example.

The image sensor according to the comparative example has a pixel arrangement based on a Bayer Pattern. Repeating units RU include two green sub-pixels, one red sub-pixel, and one blue sub-pixel, respectively. A width p0 of the repeating units RU is 0.6 μm, and this is a case in which a color separation structure for separating light of a corresponding color to be incident on each sub-pixel is provided.

Referring to FIG. 9, compared to the sensing efficiency of the red light, the sensing efficiency of the green light and the blue light is low, and a bandwidth is also greater than that of the red light.

Compared with FIG. 7, the repeating units RU according to the comparative example corresponding to a full-color pixel PX according to the example embodiment have a greater pitch than the full-color pixel PX according to the example embodiment, but the efficiency of separating and sensing color is evaluated to be lower. Furthermore, in the pixel arrangement of the comparative example, because the repeating unit RU is divided into four sub-regions to take charge of the color of the incident light, resolution degradation may occur even in signal processing. For example, R and B signals are obtained at two sub-pixel intervals, G signals are obtained at √2* sub-pixel intervals, and R/G/B signal information in the sub-pixel at a position where the signal is not obtained is obtained by inference with surrounding information. Therefore, resolution degradation is basically caused by under-sampling, and image artifacts, such as aliasing, may occur in an image restoration process.

On the other hand, in the image sensor 1000 according to the present embodiment, because each of the full color pixels PX of a very small pitch may separate and detect a color component, signal processing, such as sampling, is not required, the possibility of generating additional image artifacts is low, and thus, a high-resolution image may be obtained.

Figure 10:
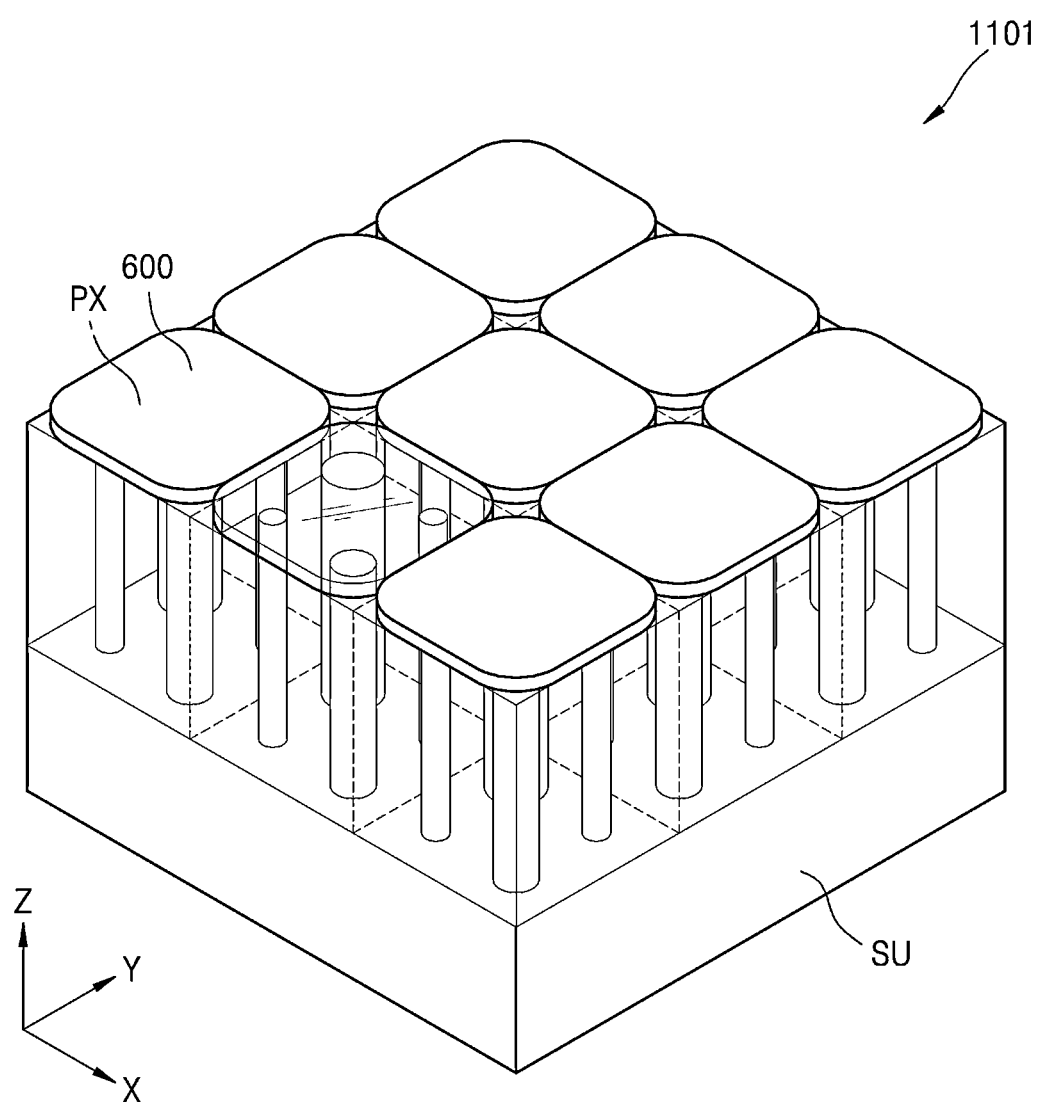
FIG. 10 is a perspective view illustrating a schematic structure of an image sensor according to another example embodiment.

FIG. 10 is a perspective view illustrating a schematic structure of a pixel array 1101 of an image sensor according to another example embodiment.

The pixel array 1101 is different from the pixel array 1100 above in that the pixel array 1101 further includes a plurality of lenses 600 facing a plurality of pixels PX one-to-one. By the lenses 600, energy exchange between adjacent pixels may be blocked, and accordingly, light efficiency may increase.

In the above descriptions, it is illustrated that one full-color pixel PX includes one first meta-photodiode 100 that absorbs red light, one second meta-photodiode 200 that absorbs green light, and two third meta-photodiodes 300 that absorb blue light, but the present inventive concept is not limited thereto, and various types and numbers of meta-photodiodes may be utilized in the image sensor according to other embodiments.

Figure 11:
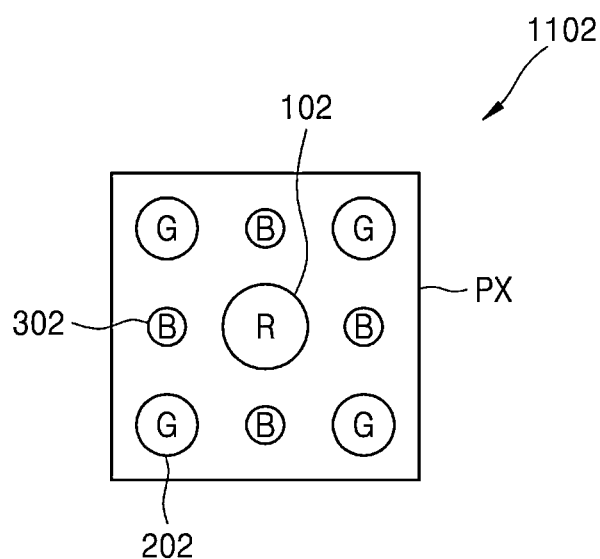
FIGS. 11 to 13 are plan views illustrating an arrangement of various types of meta-photodiodes provided in one pixel in each of the image sensors according to another example embodiment.
Figure 12:
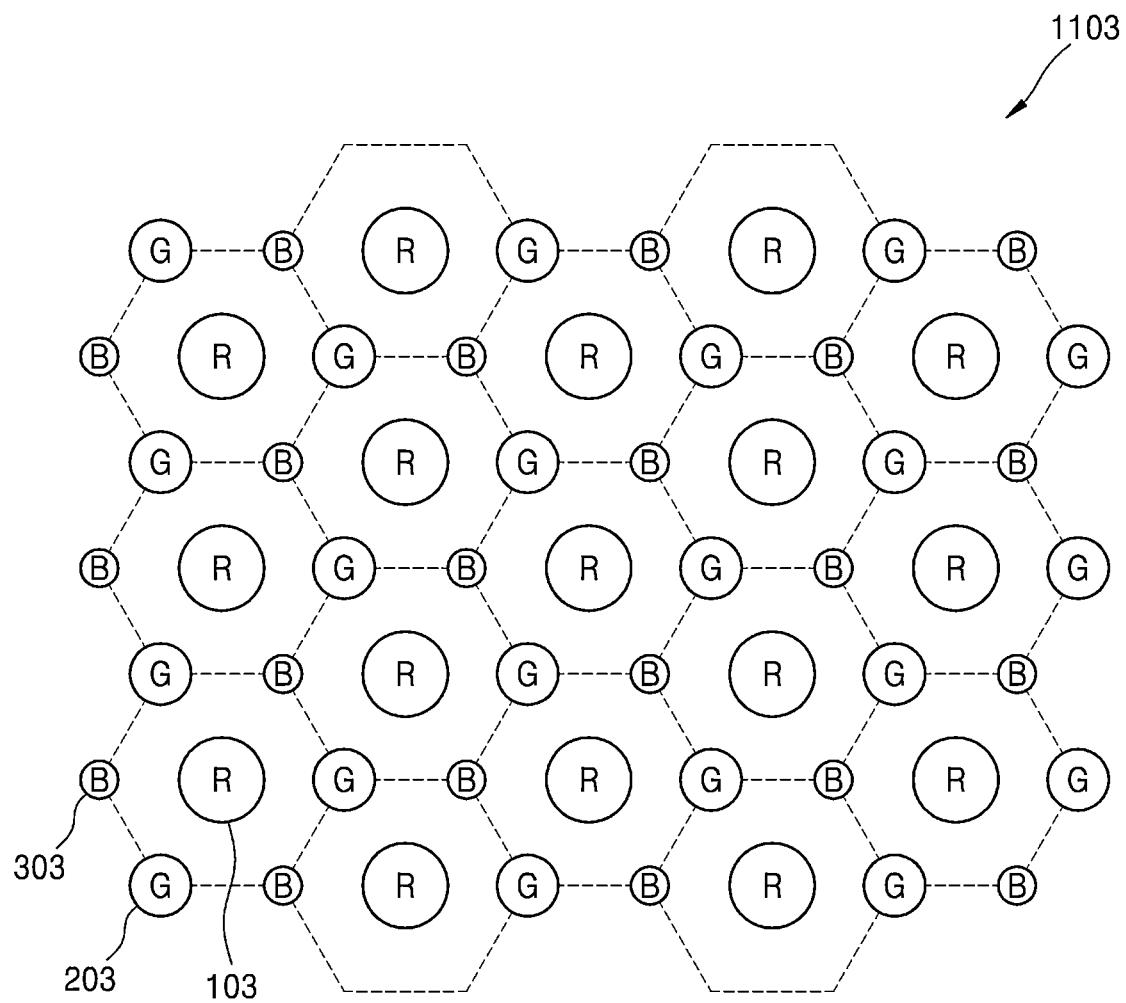
Figure 13:
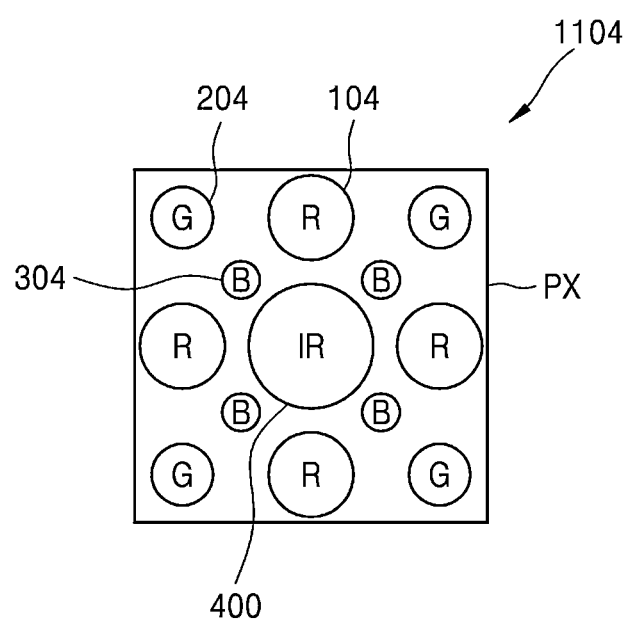

FIGS. 11 to 13 are plan views illustrating arrangements of various types of meta-photodiodes provided in one pixel in each of the image sensors according to other example embodiments.

Referring to FIG. 11, full color pixels PX constituting a pixel array 1102 may include one first meta-photodiode 102 that selectively absorbs red light, a plurality of second meta-photodiodes 202 that selectively absorb green light, and a plurality of third meta-photodiodes 302 that selectively absorb blue light. The first meta-photodiode 102 is provided at the center of the pixel PX, and four second meta-photodiodes 202 and four third meta-photodiodes 302 may be provided to surround the first meta-photodiode 102 in a square shape. Unlike the drawing, positions of the second meta-photodiodes 202 and the third meta-photodiodes 302 may be changed with each other.

Referring to FIG. 12, in a pixel array 1103, full color pixels PX may be arranged in a hexagonal grid shape. One full-color pixel PX may include one first meta-photodiode 103 for selectively absorbing red light, three second meta-photodiodes 203 for selectively absorbing green light, and three third meta-photodiodes 303 for selectively absorbing blue light. The first meta-photodiode 103 may be provided at the center of the hexagon, and the second meta-photodiode 203 and the third meta-photodiode 303 may be alternately provided at each vertex of the hexagon.

Referring to FIG. 13, a full-color pixel PX of a pixel array 1104 may include a first meta-photodiode 104 that selectively absorbs red light, a second meta-photodiode 204 that selectively absorbs green light, and a third meta-photodiode 304 that selectively absorbs blue light, and may further include a fourth meta-photodiode 400 that selectively absorbs light in an infrared wavelength band.

One fourth meta-photodiode 400 may be provided in the center of the full-color pixel PX, and four first meta-photodiodes 104, four second meta-photodiodes 204, and four third meta-photodiodes 304 may be provided surrounding the fourth meta-photodiode 400. The fourth meta-photodiode 400 may have the greatest diameter, for example, greater than 100 nm. A diameter of the third meta-photodiode 300 may be set in a range of about 100 nm to about 200 nm.

In this way, in addition to color information on an object, depth information may be further obtained from the image sensor that further includes a meta-photodiode that selectively absorbs an infrared wavelength band in addition to the meta-photodiode that selectively absorbs R, G, and B colors. For example, a camera module including the an image sensor may further include an infrared light source configured to irradiate infrared light to an object, and infrared information sensed by the image sensor may be utilized to obtain depth information of the object. That is, depth information of an object may be obtained based on infrared information sensed by the image sensor, and color information of the object may be obtained based on sensed visible light information. In addition, 3D image information may be obtained by combining color information with depth information.

Although it has been described that the pixels PX provided in the image sensor 1000 sense R, G, and B colors, the pixels PX may be modified to include a meta-photodiode capable of distinguishing and detecting light of different wavelength bands. For example, in order to obtain a hyperspectral image in an ultraviolet to infrared wavelength range, a plurality of meta-photodiodes having different cross-sectional diameters, for example 4, 8, or 16 meta-photodiodes, may be provided in one pixel. A width of a pixel, in which the meta-photodiodes are provided, may be set to be less than $\lambda_m$, which is the shortest wavelength among the wavelength bands. This is a value corresponding to a diffraction limit when an F-number of the imaging optical system is assumed to be about 1.0. A minimum width of a pixel may be set to be suitable for a diameter and the number of meta-photodiodes included in one pixel.

In addition, the pixels PX provided in the image sensor 1000 may be changed to include meta-photodiodes for sensing cyan/magenta/yellow colors, or may be configured to sense other multi-colors.

The image sensor according to the example embodiment may constitute a camera module together with module lenses having various performances, and may be utilized in various electronic apparatuses.

Figure 14:
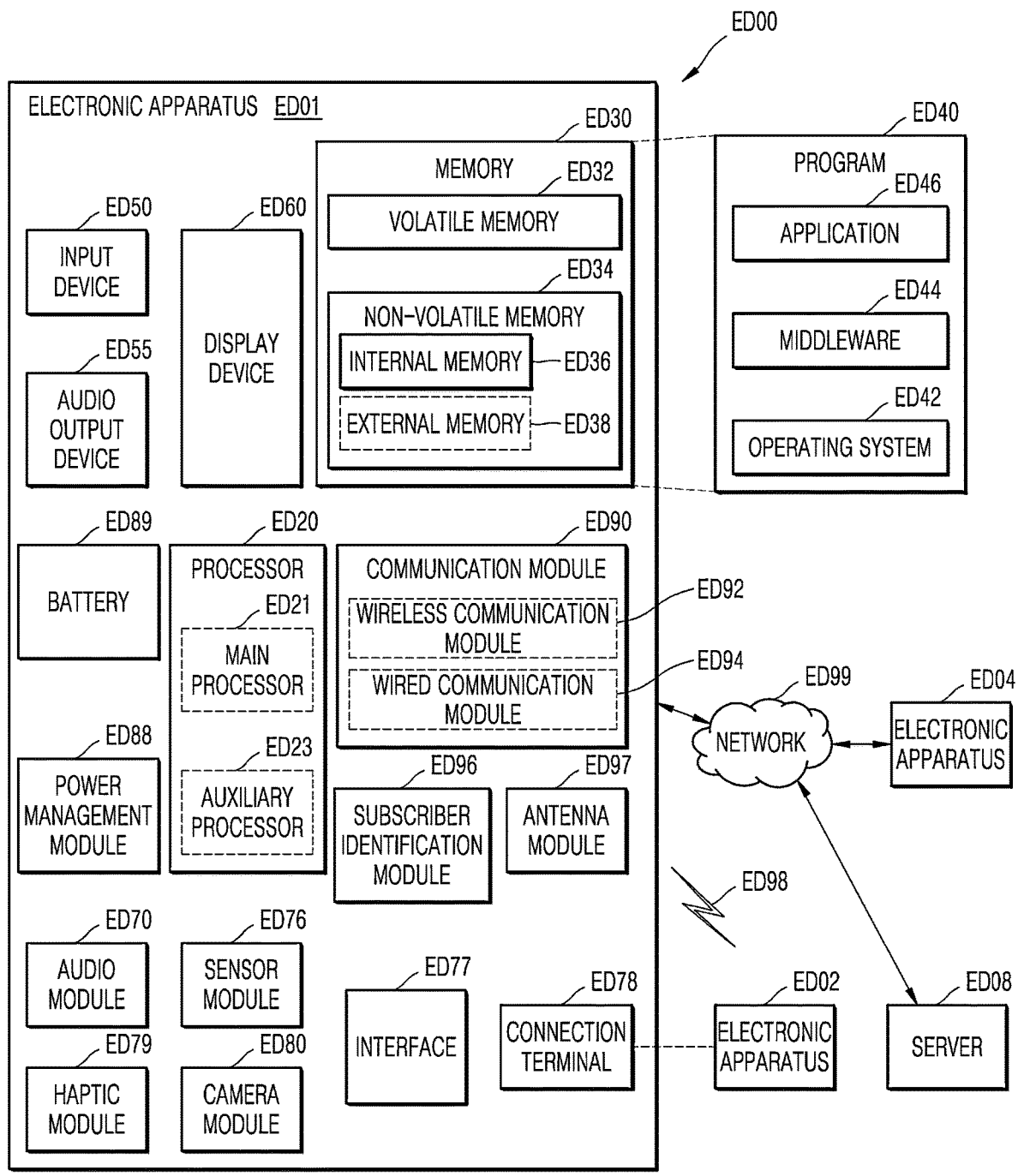
FIG. 14 is a schematic block diagram of an electronic apparatus including an image sensor according to an example embodiments.

FIG. 14 is a block diagram illustrating an example of an electronic apparatus ED01 including the image sensor 1000. Referring to FIG. 14, in a network environment ED00, the electronic apparatus ED01 may communicate with another electronic apparatus ED02 through a first network ED98 (a short-range wireless communication network, etc.) or may communicate with another electronic apparatus ED04 and/or a server ED08 through a second network ED99 (a remote wireless communication network, etc.). The electronic apparatus ED01 may communicate with the electronic apparatus ED04 through the server ED08. The electronic apparatus ED01 may include a processor ED20, a memory ED30, an input device ED50, an audio output device ED55, a display device ED60, an audio module ED70, a sensor module ED76, an interface ED77, a haptic module ED79, a connection terminal ED78, a camera module ED80, a power management module ED88, a battery ED89, a communication module ED90, a subscriber identification module ED96, and/or an antenna module ED97. In the electronic apparatus ED01, some of these components (e.g., the display device ED60) may be omitted or other components may be added. Some of these components may be implemented as one integrated circuit. For example, the sensor module ED76 (a fingerprint sensor, an iris sensor, an illuminance sensor, etc.) may be implemented by being embedded in the display device ED60 (a display, etc.).

The processor ED20 may control one or a plurality of other components (hardware, software components, etc.) of the electronic apparatus ED01 connected to the processor ED20 by executing software (e.g., a program ED40), and may perform various data processing or operations. As a part of data processing or computations, the processor ED20 may load commands and/or data received from other components (the sensor module ED76 and the communication module ED90, etc.) into a volatile memory ED32 and may process commands and/or data stored in the volatile memory ED32, and the resulting data may be stored in a non-volatile memory ED34. According to an example embodiment, the non-volatile memory ED34 may include an internal memory ED36 and/or an external memory ED38.

. The processor ED20 may include a main processor ED21 (a central processing unit, an application processor, etc.) and an auxiliary processor ED23 (a graphics processing unit, an image signal processor, a sensor hub processor, a communication processor, etc.) that may be operated independently or together with the main processor ED21. The auxiliary processor ED23 may use less power than the main processor ED21 and may perform a specialized function.

The auxiliary processor ED23 is configured to replace the main processor ED21 to control functions and/or states related to some of the components of the electronic device ED01 (the display device ED60, the sensor module ED76, the communication module ED90, etc.) while the main processor ED21 is in the inactive state (sleep state), or perform the above operation together with the main processor ED21 while the main processor ED21 is in the active state (the application execution state).,. The auxiliary processor ED23 (an image signal processor, a communication processor, etc.) may be implemented as a part of other functionally related components (the camera module ED80, the communication module ED90, etc.).

The memory ED30 may store various pieces of data required by components of the electronic apparatus ED01 (such as the processor ED20 and the sensor module ED76). The data may include, for example, input data and/or output data for software (such as the program ED40) and instructions related thereto. The memory ED30 may include the volatile memory ED32 and/or the nonvolatile memory ED34.

The program ED40 may be stored as software in the memory ED30 and may include an operating system ED42, middleware ED44, and/or an application ED46.

The input device ED50 may receive a command and/or data to be used in a component (such as, the processor ED20) of the electronic apparatus ED01 from the outside of the electronic apparatus ED01 (e.g., a user). The input device ED50 may include a microphone, a mouse, a keyboard, and/or a digital pen (such as, a stylus pen).

The audio output device ED55 may output a sound signal to the outside of the electronic apparatus ED01. The audio output device ED55 may include a speaker and/or a receiver. The speaker may be used for general purposes, such as, multimedia playback or recording playback, and the receiver may be used to receive an incoming call. The receiver may be incorporated as a part of the speaker or may be implemented as an independent separate device.

The display device ED60 may visually provide information to the outside of the electronic apparatus ED01. The display device ED60 may include a control circuit for controlling a display, a hologram device, or a projector, and a corresponding device. The display device ED60 may include touch circuitry configured to sense a touch, and/or sensor circuitry configured to measure the intensity of force generated by the touch (a pressure sensor, etc.).

The audio module ED70 may convert sound into an electric signal or, conversely, convert an electric signal into sound. The audio module ED70 may obtain sound through the input device ED50 or output sound through a speaker and/or headphones of the audio output device ED55 and/or another electronic apparatus (the electronic apparatus ED02, etc.) directly or wirelessly connected to the electronic apparatus ED01

The sensor module ED76 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor. The interface ED77 may support one or more designated protocols that may be used by the electronic apparatus ED01 to directly or wirelessly connect with another electronic apparatus (the electronic apparatus ED02, etc.).

The interface ED77 may include a High Definition Multimedia Interface (HDMI), a Universal Serial Bus (USB) interface, an SD card interface, and/or an audio interface. A connection terminal ED78 may include a connector through which the electronic apparatus ED01 may be physically connected to another electronic apparatus (the electronic apparatus ED02, etc.).

The connection terminal ED78 may include an HDMI connector, a USB connector, an SD card connector, and/or an audio connector (a headphones connector, etc.). The haptic module ED79 may convert an electrical signal into a mechanical stimulus (vibration, movement, etc.) or an electrical stimulus that may be perceived by the user through tactile or kinesthetic sense.

The haptic module ED79 may include a motor, a piezoelectric element, and/or an electrical stimulation device. The camera module ED80 may capture still images and moving images.

The camera module ED80 may include a lens assembly including one or more lenses, the image sensor 1000 of FIG. 1, image signal processors, and/or flashes. The lens assembly included in the camera module ED80 may collect light emitted from an object, an image of which is to be captured. The power management module ED88 may manage power supplied to the electronic apparatus ED01.

The power management module ED88 may be implemented as part of a Power Management Integrated Circuit (PMIC). The battery ED89 may supply power to components of the electronic apparatus ED01.

The battery ED89 may include a non-rechargeable primary cell, a rechargeable secondary cell, and/or a fuel cell. The communication module ED90 may support the establishment of a direct (wired) communication channel and/or a wireless communication channel between the electronic apparatus ED01 and other electronic apparatuses (the electronic device ED02, the electronic device ED04, the server ED08, etc.) and perform communications through the established communication channel.

The communication module ED90 may include one or a plurality of communication processors that operate independently from the processor ED20 (an application processor, etc.) and support direct communication and/or wireless communication. The communication module ED90 may include a wireless communication module ED92 (a cellular communication module, a short-range wireless communication module, and a Global Navigation Satellite System (GNSS) communication module, etc.) and/or a wired communication module ED94 (a Local Area Network (LAN) communication module, a power line communication module, etc.). Among these communication modules, a corresponding communication module may communicate with other electronic apparatuses through the first network ED98 (a short-range communication network, such as Bluetooth, WiFi Direct, or Infrared Data Association (IrDA)) or the second network ED99 (a telecommunication network, such as a cellular network, the Internet, or a computer network, such as a LAN, a wide area network (WAN), etc.). The various types of communication modules may be integrated into one component (a single chip, etc.) or implemented as a plurality of components (plural chips) separate from each other. The wireless communication module ED92 may identify and authenticate the electronic apparatus ED01 within a communication network, such as the first network ED98 and/or the second network ED99, by using subscriber information (such as, an International Mobile Subscriber Identifier (IMSI)) stored in a subscriber identification module ED96. The antenna module ED97 may transmit or receive signals and/or power to and from the outside (other electronic devices, etc.).

An antenna may include a radiator having a conductive pattern formed on a substrate (a printed circuit board (PCB), etc.). The antenna module ED97 may include one or a plurality of antennas. When a plurality of antennas are included in the antenna module ED97, an antenna suitable for a communication method used in a communication network, such as the first network ED98 and/or the second network ED99, from among the plurality of antennas may be selected by the communication module ED90. Signals and/or power may be transmitted or received between the communication module ED90 and another electronic apparatus through the selected antenna. In addition to the antenna, other components (a radio-frequency integrated circuit (RFIC), etc.) may be included as part of the antenna module ED97. Some of the components, between peripheral devices, may be connected to each other through communication methods (a bus, General Purpose Input and Output (GPIO), Serial Peripheral Interface (SPI), Mobile Industry Processor Interface (MIPI), etc.) and signals (commands, data, etc.) may be interchangeable.

Commands or data may be transmitted or received between the electronic apparatus ED01 and an external electronic apparatus (the electronic apparatus ED04) through the server ED08 connected to the second network ED99.

Figure 15:
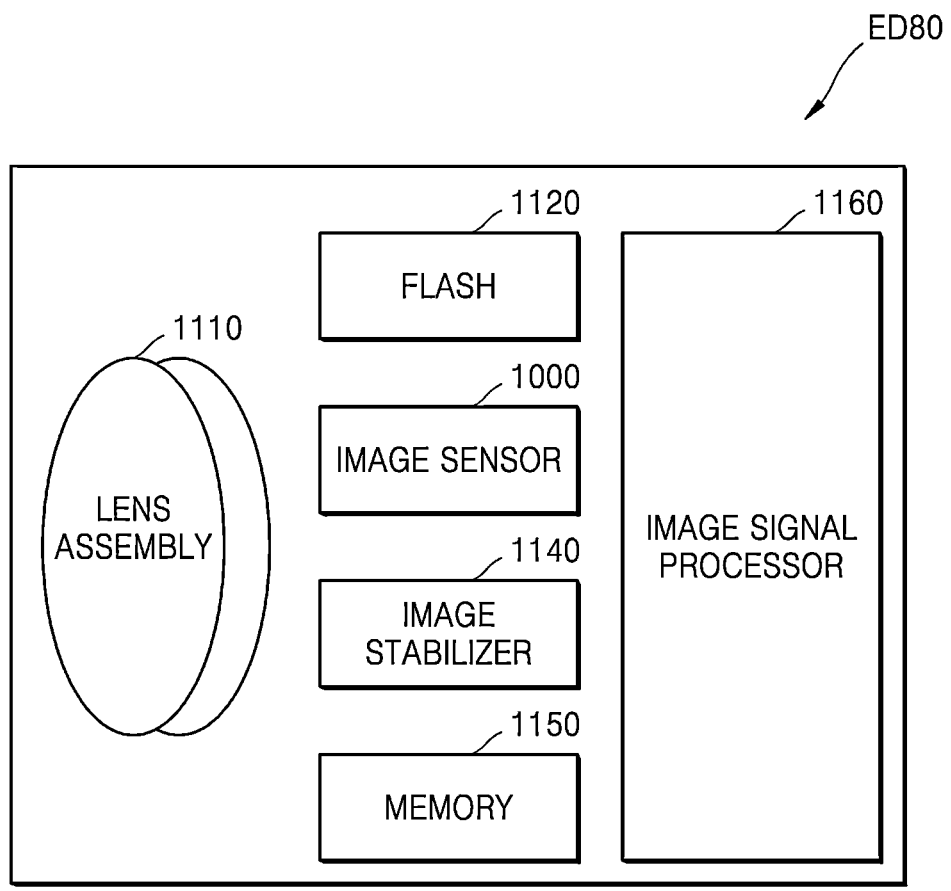
FIG. 15 is a schematic block diagram illustrating the camera module of FIG. 14.

The electronic apparatuses ED02 and ED04 may be the same type as or different types from the electronic apparatus ED01. All or part of the operations executed by the electronic apparatus ED01 may be executed by one or more of the electronic apparatuses ED02 and ED04 and the server ED08. For example, when the electronic apparatus ED01 needs to perform a function or service, the electronic apparatus ED01 may request one or more other electronic devices to perform part or all of the function or service instead of executing the function or service itself. One or more other electronic apparatuses receiving the request may execute an additional function or service related to the request, and transmit a result of the execution to the electronic apparatus ED01. To this end, cloud computing, distributed computing, and/or client-server computing technologies may be used. FIG. 15 is a block diagram illustrating a camera module ED80 included in the electronic apparatus ED01 of FIG. 14.

Referring to FIG. 15, the camera module ED80 may include a lens assembly 1110, a flash 1120, an image sensor 1000, an image stabilizer 1140, a memory 1150 (a buffer memory, etc.), and/or an image signal processor 1160. The lens assembly 1110 may collect light emitted from an object to be imaged. The camera module ED80 may include a plurality of lens assemblies 1110, and, in this case, the camera module ED80 may be a dual camera, a 360° camera, or a spherical camera. Some of the plurality of lens assemblies 1110 may have the same lens property (an angle of view, a focal length, an auto focus, an F-number, an optical zoom, etc.) or may have different lens properties. The lens assembly 1110 may include a wide-angle lens or a telephoto lens. The flash 1120 may emit light to be used to enhance light emitted or reflected from an object.

The flash 1120 may emit visible light or infrared light. The flash 1120 may include one or a plurality of light-emitting diodes (a Red-Green-Blue (RGB) LED, a White LED, an Infrared LED, an Ultraviolet LED, etc.), and/or a Xenon Lamp. The image sensor 1000 may be the image sensor 1000 described with reference to FIG. 1, and may obtain an image corresponding to the object by converting light emitted or reflected from the object and transmitted through the lens assembly 1110 into an electrical signal. The image sensor 1000 may be the image sensor 1000 of FIG. 1 described above, and the type and arrangement of meta-photodiodes included in the pixel PX provided in the image sensor 1000 may have the form described with reference to FIGS. 4 and 10 to 13, or a combination or modified form thereof.

A plurality of pixels included in the image sensor 1000 may have a small pixel width, for example, a width less than the diffraction limit. The width p of each of the plurality of pixels provided in the image sensor 1000 may satisfy a condition of $p < \lambda \cdot F$, Here, F is the F-number of the lens assembly 1110, and $\lambda$ is the center wavelength of a blue wavelength band. The image stabilizer 1140 may move one or a plurality of lenses or the image sensor 1000 included in the lens assembly 1110 in a specific direction in response to the movement of the camera module ED80 or the electronic apparatus ED01 including the camera module ED80, or may compensate for a negative influence due to movement by controlling (adjustment of read-out timing, etc.) operating characteristics of the image sensor 1000.

The image stabilizer 1140 may detect the movement of the camera module ED80 or the electronic apparatus ED01 by using a gyro sensor (not shown) or an acceleration sensor (not shown) provided inside or outside the camera module ED80. The image stabilizer 1140 may be optically implemented. The memory 1150 may store some or all of image data acquired by the image sensor 1000 for the next image processing operation.

For example, when a plurality of images are acquired at a high speed, the acquired original data (Bayer-Patterned data, high-resolution data, etc.) is stored in the memory 1150, and only a low-resolution image is displayed, and then, may be used to transmit the original data of the selected (user selection, etc.) image to the image signal processor 1160. The memory 1150 may be integrated into the memory ED30 of the electronic apparatus ED01 or may be configured as a separate memory operated independently. The image signal processor 1160 may perform image processing on images acquired by the image sensor 1000 or image data stored in the memory 1150.

Image processing may include depth map generation, three dimensional (3D) modeling, panorama generation, feature point extraction, image synthesis, and/or image compensation (noise reduction, resolution adjustment, brightness adjustment, blurring, sharpening, softening, etc.). The image signal processor 1160 may perform control (exposure time control, readout timing control, etc.) on components (the image sensor 1000, etc.) included in the camera module ED80. The image processed by the image signal processor 1160 may be stored back in the memory 1150 for further processing or provided to external components of the camera module ED80 (the memory ED30, the display device ED60, the electronic apparatus ED02, the electronic apparatus ED04, the server ED08, etc.). The image signal processor 1160 may be integrated into the processor ED20 or configured as a separate processor operated independently from the processor ED20. When the image signal processor 1160 is configured as a processor separate from the processor ED20, an image processed by the image signal processor 1160 may be displayed on the display device ED60 after additional image processing by the processor ED20. As illustrated in FIG. 13, when the image sensor 1000 includes a meta-photodiode that selectively absorbs infrared wavelength band and meta-photodiodes that selectively absorb red light, green light, and blue light separately, the image signal processor 1160 may process an infrared signal and a visible light signal acquired from the image sensor 1000 together.

The image signal processor 1160 may obtain a depth image of an object by processing an infrared signal, obtain a color image of the object from a visible light signal, and provide a three-dimensional image of the object by combining the depth image with the color image. The image signal processor 1160 may also compute information on temperature or moisture of an object from the infrared signal, and provide a temperature distribution and moisture distribution image that is combined with a two-dimensional image (color image) of the object. The electronic apparatus ED01 may further include one or more additional camera modules each having different properties or functions.

Figure 16:
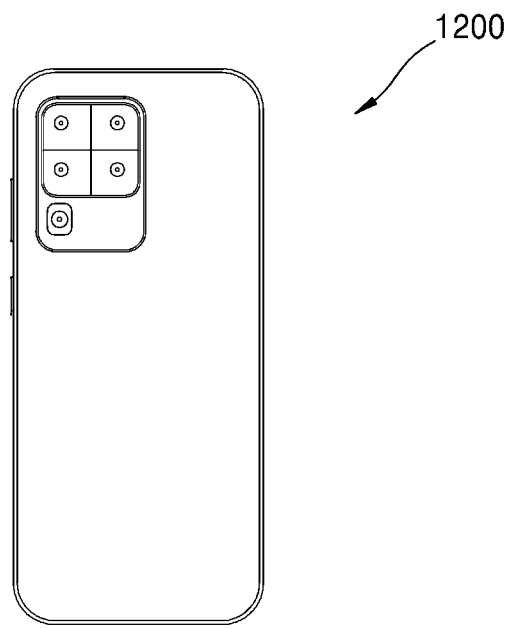
FIGS. 16 to 25 are diagrams illustrating various examples of electronic apparatuses to which the image sensors according to example embodiments are applied.
Figure 17:
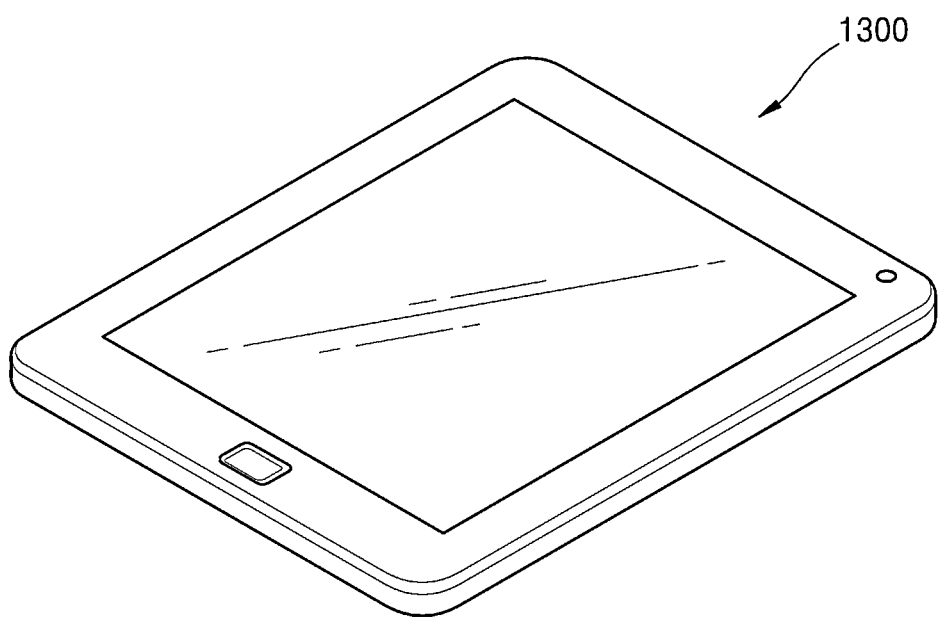
Figure 18:
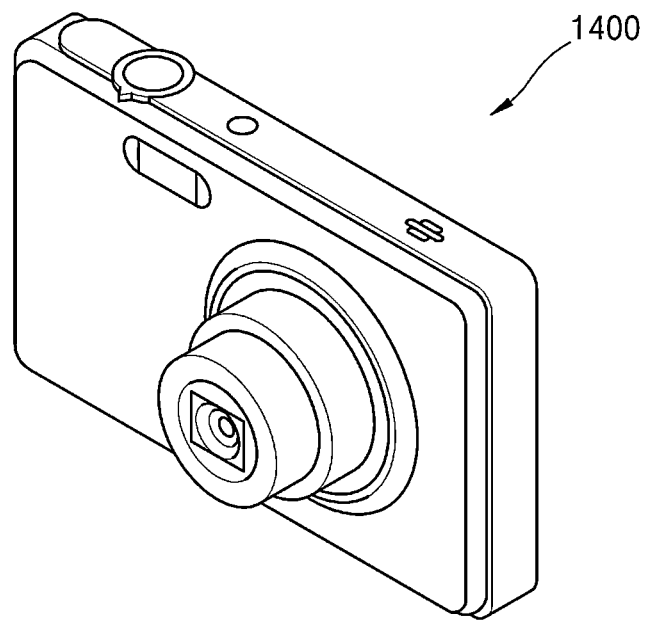
Figure 19:
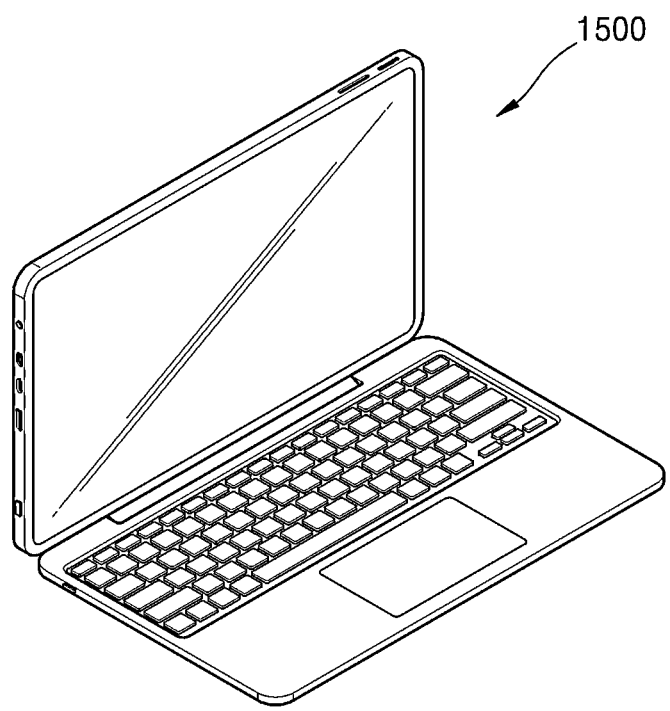
Figure 20:
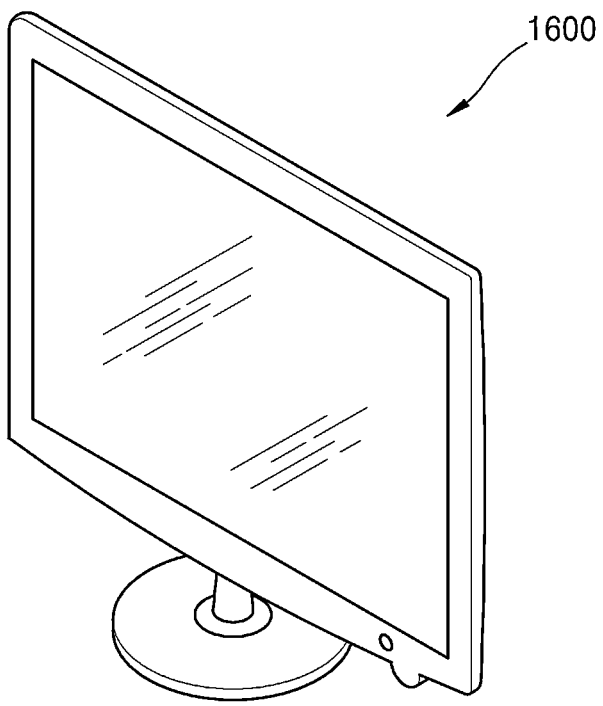

Such a camera module may also include a configuration similar to that of the camera module ED80 of FIG. 15, and an image sensor provided therein may include one or a plurality of sensors selected from image sensors having different properties, such as a Charged Coupled Device (CCD) sensor and/or a Complementary Metal Oxide Semiconductor (CMOS) sensor, an RGB sensor, a black and white (BW) sensor, an IR sensor, or a UV sensor. In this case, one of the plurality of camera modules ED80 may be a wide-angle camera and the other may be a telephoto camera. Similarly, one of the plurality of camera modules ED80 may be a front camera and the other may be a rear camera. The image sensor 1000 according to embodiments may be applied to a mobile phone or smart phone 1200 shown in FIG. 16, a tablet or smart tablet 1300 shown in FIG. 17, and a digital camera or camcorder 1400 shown in FIG. 18, a notebook computer 1500 shown in FIG. 19, or a television or smart television 1600 shown in FIG. 20.

Figure 21:
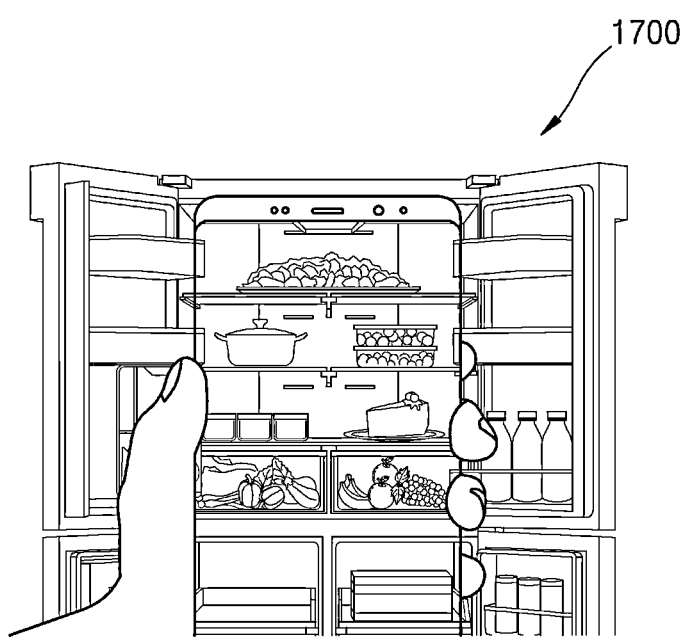
Figure 22:
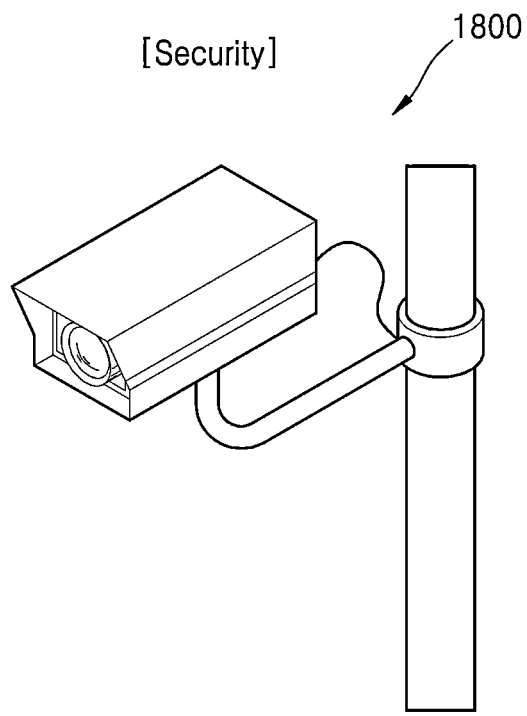
Figure 23:
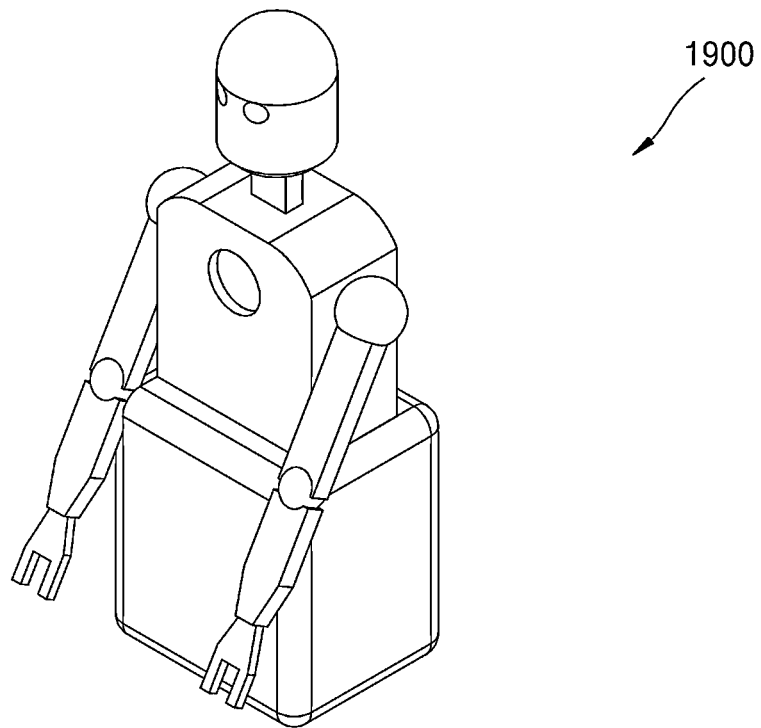
Figure 24:
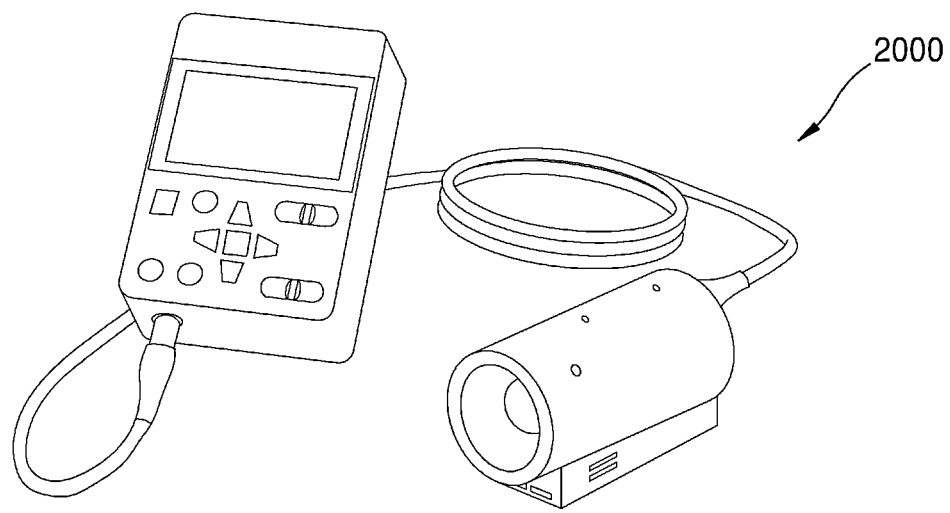

For example, the smart phone 1200 or the smart tablet 1300 may include a plurality of high-resolution cameras each having a high-resolution image sensor mounted thereon. The high-resolution cameras may be used to extract depth information of objects in an image, adjust outfocusing of an image, or automatically identify objects in an image. In addition, the image sensor 1000 may be applied to a smart refrigerator 1700 shown in FIG. 21, a security camera 1800 shown in FIG. 22, a robot 1900 shown in FIG. 23, a medical camera 2000 shown in FIG. 24, etc.

Figure 25:
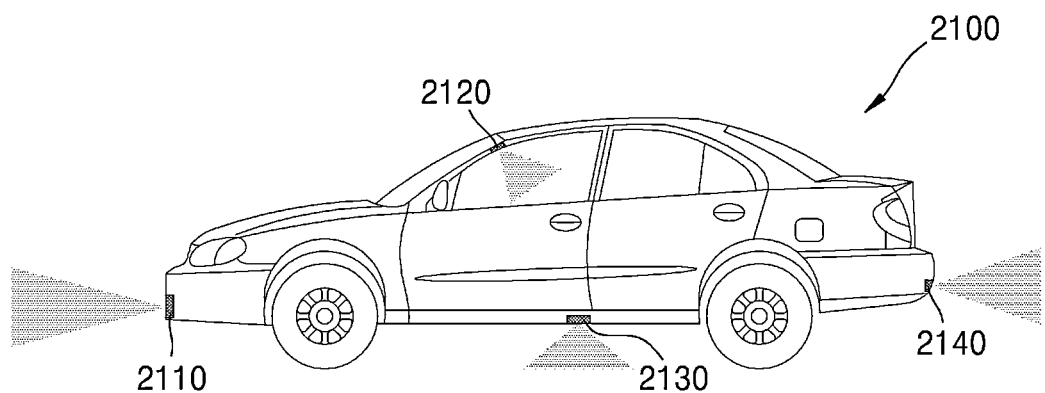

For example, the smart refrigerator 1700 may automatically recognize food in the refrigerator by using an image sensor, and inform the user of the presence of specific food, the type of food put in or take out, and the like through a smartphone. The security camera 1800 may provide an ultra-high-resolution image and may recognize an object or a person in an image even in a dark environment by using high sensitivity. The robot 1900 may provide a high-resolution image by being input at a disaster or industrial site that cannot be directly accessed by a person. The medical camera 2000 may provide a high-resolution image for diagnosis or surgery, and may dynamically adjust a field of view. Also, the image sensor 1000 may be applied to a vehicle 2100 as shown in FIG. 25.

The vehicle 2100 may include a plurality of vehicle cameras 2110, 2120, 2130, and 2140 provided in various positions. Each of the vehicle cameras 2110, 2120, 2130, and 2140 may include an image sensor according to an example embodiment. The vehicle 2100 may provide a driver with various information about an interior or surroundings of the vehicle 2100 by using the plurality of vehicle cameras 2110, 2120, 2130, and 2140, and provide information necessary for autonomous driving by automatically recognizing objects or people in the image. In the image sensor described above, each pixel having a small width less than a diffraction limit may detect light of a plurality of types of wavelength bands separately.

The image sensor described above may exhibit high luminous efficiency by not using components, such as a color separation element and a color filter.

The image sensor described above may be used as a multi-color sensor, a multy-wavelength sensor, a hyperspectral sensor, and may be used as a 3D image sensor that provides both a color image and a depth image.

The image sensor described above may be may be applied as a high resolution camera module to be utilized in various electronic devices.

Although the image sensor described above and the electronic device including the same have been described with reference to the embodiment shown in the drawings, this is merely an example. Therefore, it will be understood by those skilled in the art that various changes in form and details may be made therein without departing from the spirit and scope of the inventive concept.

The example embodiments should be considered in descriptive sense only and not for purposes of limitation. Therefore, the scope of the inventive concept is defined not by the detailed description of the inventive concept but by the appended claims, and all differences within the scope will be construed as being included in the inventive concept. It should be understood that embodiments described herein should be considered in a descriptive sense only and not for purposes of limitation.

Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. An image sensor comprising:
 a plurality of pixels two-dimensionally arranged, each of the plurality of pixels comprising:
  a first meta-photodiode configured to selectively absorb light of a red wavelength band;
  a second meta-photodiode configured to selectively absorb light in a green wavelength band; and a third meta-photodiode configured to selectively absorb light in a blue wavelength band,
wherein a width p of each of the plurality of pixels is less than or equal to a diffraction limit, wherein each of the first meta-photodiode, the second meta-photodiode and the third meta-photodiode has a columnar vertical structure.

2. The image sensor of claim 1, wherein each of the first meta-photodiode, the second meta-photodiode, and the third meta-photodiode has a rod shape including a first conductivity-type semiconductor layer, an intrinsic semiconductor layer, and a second conductivity-type semiconductor layer stacked in a first direction,
wherein a cross-section of the first meta-photodiode perpendicular to the first direction has a first width, a cross-section of the second meta-photodiode perpendicular to the first direction has a second width, and a cross-section of the third meta-photodiode perpendicular to the first direction has a third width, and
wherein the first width, the second width and the third width are different from each other.

3. The image sensor of claim 2, wherein a height of each of the first meta-photodiode, the second meta-photodiode, and the third meta-photodiode in the first direction is 500 nm or more.

4. The image sensor of claim 2, wherein the first width, the second width, and the third width are in a range of about 50 nm to about 200 nm.

5. The image sensor of claim 2, wherein the width p is in a range of $0.25\ \mu m \leq p \leq 0.45\ \mu m$.

6. The image sensor of claim 2, wherein the first width is larger than the second width and the second width is larger than the third width.

7. The image sensor of claim 2, wherein a number of first meta-photodiodes included in a pixel is one, a number of second meta-photodiodes included in the pixel is one, and a number of third meta-photodiodes included in the pixel is two, wherein the first meta-photodiode, the second meta-photodiode, and the third meta-photodiode are provided so that a line connecting centers of the one first meta-photodiode, the one second meta-photodiodes, and the two third meta-photodiodes is a square.

8. The image sensor of claim 7, wherein the two third meta-photodiodes are arranged in a diagonal direction of the square.

9. The image sensor of claim 2, wherein a number of first meta-photodiodes included in a pixel is one, a number of second meta-photodiodes included in the pixel is more than one, and a number of third meta-photodiode included in the pixel is more than one, and wherein the first meta-photodiode is provided at the center of the pixel.

10. The image sensor of claim 9, wherein the second meta-photodiode and the third meta-photodiode surround the first meta-photodiode in a square or regular hexagonal shape.

11. The image sensor of claim 2, further comprising a fourth meta-photodiode that selectively absorbs light in an infrared wavelength band in each of the plurality of pixels.

12. The image sensor of claim 11, wherein a width of a cross-section of the fourth meta-photodiode perpendicular to the first direction is greater than the first width, the second width, and the third width.

13. The image sensor of claim 12, wherein a number of fourth meta-photodiodes included in a pixel is one, a number of first meta-photodiodes included in the pixel is more than one, a number of second meta-photodiodes included in the pixel is more than one, and a number of third meta-photodiode included in the pixel is more than one, and
wherein the fourth meta-photodiode is provided at the center of the one pixel.

14. The image sensor of claim 1, further comprising a plurality of lenses facing the plurality of pixels in a one-to-one manner.

15. The image sensor of claim 1, further comprising a circuit board supporting the first meta-photodiode, the second meta-photodiode, and the third meta-photodiode, the circuit board including circuit elements for processing signals from the plurality of pixels.

16. An image sensor comprising:
a plurality of pixels two-dimensionally arranged, each of the plurality of pixels including:
two or more meta-photodiodes that selectively absorb light of two or more different wavelength bands, and
a width of each of the plurality of pixels is less than or equal to a shortest wavelength among different wavelength bands.

17. The image sensor of claim 16, wherein each of the two or more meta-photodiodes has a rod shape including a first conductivity-type semiconductor layer, an intrinsic semiconductor layer, and a second conductivity-type semiconductor layer stacked in a first direction,
wherein the two or more meta-photodiodes include a first meta-photodiode, a second meta-photodiode, and a third meta-photodiode,
wherein a cross-section of the first meta-photodiode perpendicular to the first direction has a first width, a cross-section of the second meta-photodiode perpendicular to the first direction has a second width, and a cross-section of the third meta-photodiode perpendicular to the first direction has a third width, and
wherein the first width, the second width and the third width are different from each other.

18. The image sensor of claim 17, wherein, among the two or more meta-photodiodes, a first meta-photodiode absorbs light of a first wavelength, and a second meta-photodiode absorbs light of a second wavelength,
wherein the first wavelength is longer than the second wavelength, and
wherein the first meta-photodiode has a greater width than the second meta-photodiode.

19. An electronic apparatus comprising:
a lens assembly including one or more lenses, the lens assembly configured to form an optical image of an object;
an image sensor configured to convert the optical image formed by the lens assembly into an electrical signal; and
a processor configured to process the electrical signal generated by the image sensor, wherein
the image sensor includes a plurality of pixels two-dimensionally arranged, each of the plurality of pixels including a first meta-photodiode configured to selectively absorb light of a red wavelength band, a second meta-photodiode configured to selectively absorb light of a green wavelength band and a third meta-photodiode configured to selectively absorb light of a blue wavelength band, and
wherein a width p of each of the plurality of pixels satisfies the following:
$p < \lambda \cdot F$,
where, F is an F-number of the lens assembly, and $\lambda$ is a center wavelength of a blue wavelength band.

20. The electronic apparatus of claim 19, wherein each of the plurality of pixels of the image sensor further comprises a fourth meta-photodiode that selectively absorbs light of an infrared wavelength band, and the processor calculates color information and depth information of the object.

* * * * *